(12) United States Patent
Broughton et al.

(10) Patent No.: US 9,730,275 B2
(45) Date of Patent: Aug. 8, 2017

(54) GAS TURBINE ENGINE SYSTEMS

(71) Applicant: ROLLS-ROYCE PLC, London (GB)

(72) Inventors: Paul Broughton, Leicester (GB); Richard Peace, Derby (GB); Gary Alan Skinner, Nottingham (GB); Robin Charles Kennea, Nottingham (GB)

(73) Assignee: ROLLS-ROYCE plc, London (GB)

( * ) Notice: Subject to any disclaimer, the term of this patent is extended or adjusted under 35 U.S.C. 154(b) by 563 days.

(21) Appl. No.: 13/716,587

(22) Filed: Dec. 17, 2012

(65) Prior Publication Data

US 2013/0160465 A1 Jun. 27, 2013

(30) Foreign Application Priority Data

Dec. 22, 2011 (GB) .................................. 1122140.5
Dec. 22, 2011 (GB) .................................. 1122143.9
Mar. 7, 2012 (GB) .................................. 1203991.3

(51) Int. Cl.
*F02C 7/12* (2006.01)
*H05B 3/28* (2006.01)
(Continued)

(52) U.S. Cl.
CPC ................ *H05B 3/28* (2013.01); *B23P 6/005* (2013.01); *B60R 16/00* (2013.01); *B60R 16/02* (2013.01);
(Continued)

(58) Field of Classification Search
CPC ...... H01R 12/515; H01R 12/57; H01R 12/00; H01R 12/51; H01R 12/592; H01R 12/59;
(Continued)

(56) References Cited

U.S. PATENT DOCUMENTS 2,523,083 A 9/1950 Witkowski
2,523,504 A 9/1950 Ford, Jr.
(Continued)

FOREIGN PATENT DOCUMENTS

DE 2941950 B1 2/1981
DE 102009047334 A1 6/2011
(Continued)

OTHER PUBLICATIONS

Aug. 5, 2013 Search Report issued in British Patent Application No. 1308033.8.
(Continued)

*Primary Examiner* — Patrick Hamo
(74) *Attorney, Agent, or Firm* — Oliff PLC

(57) ABSTRACT

A gas turbine engine 10 comprises at least one rigid raft assembly that has a fluid passageway 210 at least partially embedded therein. The fluid passageway 210 is at least a part of a fluid system. In addition to the fluid passageway 210, the rigid raft assembly 200 also has at least a part of another system. For example, the rigid raft assembly may also include electrical conductors 252, which are part of an electrical system. The rigid raft assembly 200 may be lighter, easier to assemble, more robust and more compact than conventional solutions for providing systems to gas turbine engines.

18 Claims, 8 Drawing Sheets

(51) Int. Cl.
*F02C 7/20* (2006.01)
*B23P 6/00* (2006.01)
*H02G 3/04* (2006.01)
*H01R 12/00* (2006.01)
*H02G 3/32* (2006.01)
*B60R 16/02* (2006.01)
*B64C 3/34* (2006.01)
*F02C 7/141* (2006.01)
*B60R 16/08* (2006.01)
*F02C 7/16* (2006.01)
*H01R 12/57* (2011.01)
*H01R 12/59* (2011.01)
*H01R 12/51* (2011.01)
*H01R 12/61* (2011.01)
*H02G 3/00* (2006.01)
*B60R 16/00* (2006.01)
*B64D 29/08* (2006.01)
*F02C 7/00* (2006.01)
*F02C 7/32* (2006.01)
*H02G 1/00* (2006.01)
*H02G 3/02* (2006.01)
*F02C 7/047* (2006.01)
*F02C 7/224* (2006.01)
*F24H 1/10* (2006.01)
*H05B 1/02* (2006.01)
*H05K 7/20* (2006.01)

(52) U.S. Cl.
CPC ...... *B60R 16/0207* (2013.01); *B60R 16/0215* (2013.01); *B60R 16/08* (2013.01); *B64C 3/34* (2013.01); *B64D 29/08* (2013.01); *F02C 7/00* (2013.01); *F02C 7/047* (2013.01); *F02C 7/12* (2013.01); *F02C 7/141* (2013.01); *F02C 7/16* (2013.01); *F02C 7/20* (2013.01); *F02C 7/224* (2013.01); *F02C 7/32* (2013.01); *F24H 1/105* (2013.01); *H01R 12/00* (2013.01); *H01R 12/51* (2013.01); *H01R 12/515* (2013.01); *H01R 12/57* (2013.01); *H01R 12/59* (2013.01); *H01R 12/592* (2013.01); *H01R 12/61* (2013.01); *H02G 1/00* (2013.01); *H02G 3/00* (2013.01); *H02G 3/02* (2013.01); *H02G 3/04* (2013.01); *H02G 3/32* (2013.01); *H05B 1/0236* (2013.01); *H05K 7/20* (2013.01); *F05D 2260/30* (2013.01); *Y02T 50/672* (2013.01); *Y10T 29/49002* (2015.01); *Y10T 29/49117* (2015.01); *Y10T 29/49234* (2015.01); *Y10T 29/49236* (2015.01); *Y10T 29/49238* (2015.01); *Y10T 156/10* (2015.01)

(58) Field of Classification Search
CPC . H01R 12/61; B60R 16/0207; B60R 16/0215; F02C 7/32
See application file for complete search history.

(56) References Cited

U.S. PATENT DOCUMENTS

| | | | |
|---|---|---|---|
| 2,866,522 A | 12/1958 | Morley | |
| 2,877,544 A | 3/1959 | Gammel | |
| 2,963,538 A | 12/1960 | Dahlgren | |
| 3,086,071 A | 4/1963 | Preston | |
| 3,128,214 A | 4/1964 | Lay | |
| 3,168,617 A | 2/1965 | Richter | |
| 3,284,003 A | 11/1966 | Ciemochowski | |
| 3,494,657 A | 2/1970 | Harper et al. | |
| 3,612,744 A | 10/1971 | Thomas | |
| 3,700,825 A | 10/1972 | Taplin et al. | |
| 3,710,568 A | 1/1973 | Rice | |
| 4,137,888 A | 2/1979 | Allan | |
| 4,149,567 A | 4/1979 | Weirich | |
| 4,180,608 A | 12/1979 | Del | |
| 4,220,912 A | 9/1980 | Williams | |
| 4,488,970 A | 12/1984 | Clark | |
| 4,533,787 A | 8/1985 | Anderegg et al. | |
| 4,652,064 A | 3/1987 | Cetrone | |
| 4,671,593 A | 6/1987 | Millon-Fremillon et al. | |
| 4,846,405 A | 7/1989 | Zimmermann | |
| 5,004,639 A | 4/1991 | Desai | |
| 5,012,639 A | 5/1991 | Ream et al. | |
| 5,031,396 A | 7/1991 | Margnelli | |
| 5,048,747 A | 9/1991 | Clark et al. | |
| 5,091,605 A | 2/1992 | Clifford | |
| 5,097,390 A | 3/1992 | Gerrie et al. | |
| 5,138,784 A | 8/1992 | Niwa | |
| 5,142,448 A | 8/1992 | Kober et al. | |
| 5,174,110 A * | 12/1992 | Duesler ................... | F02C 7/32 138/111 |
| 5,249,417 A | 10/1993 | Duesler et al. | |
| 5,435,124 A | 7/1995 | Sadil et al. | |
| 5,509,599 A | 4/1996 | Laue | |
| 5,688,145 A | 11/1997 | Liu | |
| 5,691,509 A | 11/1997 | Balzano | |
| 5,692,909 A | 12/1997 | Gadzinski | |
| 5,795,172 A | 8/1998 | Shahriari et al. | |
| 5,870,824 A | 2/1999 | Lilja et al. | |
| 5,876,013 A | 3/1999 | Ott | |
| 5,885,111 A | 3/1999 | Yu | |
| 5,895,889 A | 4/1999 | Uchida et al. | |
| 6,050,853 A | 4/2000 | Ando et al. | |
| 6,148,500 A | 11/2000 | Krone et al. | |
| 6,157,542 A | 12/2000 | Wu | |
| 6,328,010 B1 | 12/2001 | Thurman | |
| 6,344,616 B1 | 2/2002 | Yokokawa | |
| 6,399,889 B1 | 6/2002 | Korkowski et al. | |
| 6,434,473 B1 | 8/2002 | Hattori | |
| 6,481,101 B2 | 11/2002 | Reichinger | |
| 6,588,820 B2 | 7/2003 | Rice | |
| 6,689,446 B2 | 2/2004 | Barnes et al. | |
| 6,702,607 B2 | 3/2004 | Kondo | |
| 6,849,805 B2 | 2/2005 | Honda et al. | |
| 6,969,807 B1 | 11/2005 | Lin et al. | |
| 6,971,650 B2 | 12/2005 | Marelja | |
| 6,971,841 B2 | 12/2005 | Care | |
| 7,002,269 B2 | 2/2006 | Angerpointer | |
| 7,010,906 B2 * | 3/2006 | Cazenave ............... | C22C 14/00 138/111 |
| 7,232,315 B2 | 6/2007 | Uchida et al. | |
| 7,281,318 B2 | 10/2007 | Marshall et al. | |
| 7,316,390 B2 | 1/2008 | Burlison | |
| 7,389,977 B1 | 6/2008 | Fernandez et al. | |
| 7,414,189 B2 | 8/2008 | Griess | |
| 7,500,644 B2 | 3/2009 | Naudet et al. | |
| 7,506,499 B2 | 3/2009 | Fert et al. | |
| 7,516,621 B2 | 4/2009 | Suttie et al. | |
| 7,525,816 B2 | 4/2009 | Sawachi | |
| 7,543,442 B2 | 6/2009 | Derenes et al. | |
| 7,592,546 B2 * | 9/2009 | Johansson ........... | B60R 16/0215 174/68.1 |
| 7,661,272 B2 | 2/2010 | Gagneux et al. | |
| 7,719,378 B2 | 5/2010 | Blair et al. | |
| 7,745,730 B2 | 6/2010 | Bailey | |
| 7,762,502 B2 | 7/2010 | Mesing et al. | |
| 7,837,497 B1 | 11/2010 | Matsuo et al. | |
| 7,862,348 B2 | 1/2011 | Strauss | |
| 8,038,104 B1 | 10/2011 | Larkin | |
| 8,137,524 B2 | 3/2012 | Berggren et al. | |
| 8,317,524 B2 | 11/2012 | Bailey | |
| 8,491,013 B2 | 7/2013 | Peer et al. | |
| 8,581,103 B2 | 11/2013 | Aspas Puertolas | |
| 8,794,584 B2 | 8/2014 | Shimada et al. | |
| 8,932,066 B2 | 1/2015 | Broughton | |
| 8,937,254 B2 | 1/2015 | Wen et al. | |
| 9,010,716 B2 | 4/2015 | Kobori | |
| 9,040,821 B2 | 5/2015 | Blanchard et al. | |
| 9,139,144 B2 | 9/2015 | Broughton | |
| 9,259,808 B2 | 2/2016 | Broughton et al. | |
| 9,338,830 B2 | 5/2016 | Broughton et al. | |

(56) References Cited

U.S. PATENT DOCUMENTS

| | | |
|---|---|---|
| 9,456,472 B2 | 9/2016 | Dalton et al. |
| 2002/0046870 A1 | 4/2002 | Zein et al. |
| 2002/0084382 A1 | 7/2002 | Crist |
| 2002/0086586 A1 | 7/2002 | Shi et al. |
| 2002/0170729 A1 | 11/2002 | Murakami et al. |
| 2002/0170740 A1 | 11/2002 | Yamanobe et al. |
| 2003/0095389 A1 | 5/2003 | Samant et al. |
| 2003/0155467 A1 | 8/2003 | Petrenko |
| 2003/0183733 A1 | 10/2003 | Pisczak |
| 2004/0065092 A1 | 4/2004 | Wadia et al. |
| 2004/0266266 A1 | 12/2004 | Lai |
| 2004/0266274 A1* | 12/2004 | Naudet .................. F02C 7/222 439/719 |
| 2005/0257956 A1 | 11/2005 | Marshall et al. |
| 2006/0272340 A1 | 12/2006 | Petrenko |
| 2007/0018057 A1 | 1/2007 | Kovac |
| 2007/0029454 A1 | 2/2007 | Suttie et al. |
| 2007/0084216 A1 | 4/2007 | Mazeaud et al. |
| 2007/0129902 A1 | 6/2007 | Orbell |
| 2007/0170312 A1 | 7/2007 | Al-Khalil |
| 2007/0234559 A1 | 10/2007 | Tokuda et al. |
| 2008/0128048 A1 | 6/2008 | Johnson et al. |
| 2008/0179448 A1 | 7/2008 | Layland et al. |
| 2008/0185478 A1 | 8/2008 | Dannenberg |
| 2008/0245932 A1 | 10/2008 | Prellwitz et al. |
| 2009/0067979 A1 | 3/2009 | Braley et al. |
| 2009/0072091 A1 | 3/2009 | Al-Khalil |
| 2009/0095842 A1 | 4/2009 | Gaertner, II et al. |
| 2009/0134272 A1 | 5/2009 | Vauchel |
| 2009/0189051 A1 | 7/2009 | Love |
| 2009/0230650 A1 | 9/2009 | Mayen et al. |
| 2009/0242703 A1 | 10/2009 | Alexander et al. |
| 2009/0277578 A1 | 11/2009 | Sung et al. |
| 2009/0289232 A1* | 11/2009 | Rice .................. H01B 1/24 252/511 |
| 2010/0162726 A1 | 7/2010 | Robertson et al. |
| 2010/0261365 A1 | 10/2010 | Sakakura |
| 2010/0293987 A1 | 11/2010 | Horst et al. |
| 2010/0308169 A1 | 12/2010 | Blanchard et al. |
| 2011/0011627 A1 | 1/2011 | Aspas Puertolas |
| 2011/0014803 A1 | 1/2011 | Bailey |
| 2011/0016882 A1 | 1/2011 | Woelke et al. |
| 2011/0017879 A1 | 1/2011 | Woelke et al. |
| 2011/0053468 A1 | 3/2011 | Vontell |
| 2011/0056961 A1 | 3/2011 | Amtmann et al. |
| 2011/0111616 A1 | 5/2011 | Chang et al. |
| 2011/0120748 A1 | 5/2011 | Bailey |
| 2011/0236182 A1 | 9/2011 | Wiebe et al. |
| 2011/0271655 A1 | 11/2011 | Poisson |
| 2011/0315830 A1 | 12/2011 | Eshima et al. |
| 2012/0012710 A1 | 1/2012 | Yamaguchi et al. |
| 2012/0103685 A1 | 5/2012 | Blanchard et al. |
| 2012/0111614 A1 | 5/2012 | Free |
| 2012/0312022 A1 | 12/2012 | Lam et al. |
| 2013/0048344 A1 | 2/2013 | Lou |
| 2013/0092434 A1 | 4/2013 | Kato et al. |
| 2013/0160458 A1 | 6/2013 | Willmot et al. |
| 2013/0160460 A1 | 6/2013 | Dalton et al. |
| 2013/0160464 A1 | 6/2013 | Maszczk et al. |
| 2013/0189868 A1 | 7/2013 | Fitt et al. |
| 2013/0316147 A1 | 11/2013 | Douglas et al. |
| 2014/0208712 A1 | 7/2014 | Dowdell |
| 2014/0208770 A1 | 7/2014 | Fitt et al. |
| 2014/0290271 A1 | 10/2014 | Dalton |
| 2014/0305134 A1 | 10/2014 | Amarasinghe et al. |
| 2014/0305136 A1 | 10/2014 | Taylor |
| 2014/0325992 A1 | 11/2014 | Summerfield |
| 2014/0325993 A1 | 11/2014 | Broughton et al. |
| 2014/0325994 A1 | 11/2014 | Dowdell et al. |
| 2014/0326058 A1 | 11/2014 | Broughton |
| 2014/0327299 A1 | 11/2014 | Broughton et al. |
| 2014/0328030 A1 | 11/2014 | Broughton |
| 2015/0342022 A1 | 11/2015 | Willmot et al. |
| 2016/0056578 A1 | 2/2016 | Taylor |
| 2016/0057873 A1 | 2/2016 | Richardson et al. |
| 2016/0069213 A1 | 3/2016 | Fitt et al. |
| 2016/0072210 A1 | 3/2016 | Armstrong et al. |
| 2016/0096288 A1 | 4/2016 | Dowdell |

FOREIGN PATENT DOCUMENTS

| | | |
|---|---|---|
| EP | 1741879 A1 | 1/2007 |
| EP | 1 760 291 A2 | 3/2007 |
| EP | 1 762 714 A2 | 3/2007 |
| EP | 2279852 A1 | 2/2011 |
| EP | 2 590 270 A2 | 5/2013 |
| FR | 2871284 A1 | 12/2005 |
| GB | 1260339 A | 1/1972 |
| GB | 2152147 A | 7/1985 |
| GB | 2477337 A | 8/2011 |
| JP | A-63-285808 | 11/1988 |
| JP | A-4-167376 | 6/1992 |
| JP | A-4-223067 | 8/1992 |
| JP | A-5-129040 | 5/1993 |
| JP | A-2000-299151 | 10/2000 |
| WO | 2009/118561 A1 | 10/2009 |
| WO | WO 2010/075390 A2 | 7/2010 |
| WO | WO 2011/061074 A1 | 5/2011 |
| WO | WO 2011/117609 | 9/2011 |
| WO | WO 2011/127996 A1 | 10/2011 |

OTHER PUBLICATIONS

Broughton et al., U.S. Appl. No. 14/100,745, filed Dec. 9, 2013.
Apr. 23, 2014 European Search Report issued in European Patent Application No. 12 19 7402.
Apr. 24, 2014 European Search Report issued in European Patent Application No. 13 19 5848.
Oct. 25, 2013 European Search Report issued in European Patent Application No. 13 15 8531.
Aug. 15, 2014 Office Action issued in U.S. Appl. No. 13/716,497.
Nov. 10, 2014 Office Action issued in U.S. Appl. No. 13/716,300.
Nov. 20, 2014 Office Action issued in U.S. Appl. No. 13/716,648.
Feb. 25, 2015 Office Action issued in U.S. Appl. No. 13/716,497.
Mar. 11, 2015 Office Action issued in U.S. Appl. No. 13/716,300.
Jun. 5, 2015 Office Action issued in U.S. Appl. No. 13/716,708.
Jun. 12, 2015 Office Action in U.S. Appl. No. 13/716,254.
Jun. 19, 2015 Office Action issued in U.S. Appl. No. 13/716,244.
Nellis and Klein, "Heat Transfer", 2009, Campridge University, pp. 748-751.
Jul. 28, 2015 Office Action issued in U.S. Appl. No. 13/716,796.
Jul. 29, 2015 Office Action issued in U.S. Appl. No. 13/716,648.
Jul. 17, 2015 Office Action issued in U.S. Appl. No. 13/716,497.
Aug. 13, 2015 Office Action issued in U.S. Appl. No. 13/716,516.
Aug. 14, 2015 Office Action issued in U.S. Appl. No. 13/716,239.
Aug. 27, 2015 Office Action issued in U.S. Appl. No. 13/792,851.
Apr. 20, 2012 Search Report issued in British Patent Application No. GB1122140.5.
Apr. 19, 2012 Search Report issued in British Patent Application No. GB1122143.9.
Jun. 21, 2012 Search Report issued in British Patent Application No. GB1203991.3.
Jul. 31, 2012 Search Report issued in British Patent Application No. GB1207733.5.
Aug. 7, 2012 Search Report issued in British Patent Application No. GB1207735.0.
Oct. 23, 2012 Search Report issued in British Patent Application No. GB1212221.4.
Nov. 7, 2012 Search Report issued in British Patent Application No. GB1212223.0.
Broughton et al., Pending U.S. Appl. No. 13/716,648, filed Dec. 17, 2012.
Broughton et al., Pending U.S. Appl. No. 13/716,439, filed Dec. 17, 2012.
Broughton et al., Pending U.S. Appl. No. 13/716,254, filed Dec. 17, 2012.
Willmot et al., Pending U.S. Appl. No. 13/716,300, filed Dec. 17, 2012.

(56) References Cited

OTHER PUBLICATIONS

Willmot et al., Pending U.S. Appl. No. 13/716,239, filed Dec. 17, 2012.
Broughton et al., Pending U.S. Appl. No. 13/716,497, filed Dec. 17, 2012.
Maszczk et al., Pending U.S. Appl. No. 13/716,796, filed Dec. 17, 2012.
Willmot et al., Pending U.S. Appl. No. 13/716,808, filed Dec. 17, 2012.
Broughton et al., Pending U.S. Appl. No. 13/716,708, filed Dec. 17, 2012.
Dalton et al., Pending U.S. Appl. No. 13/716,244, filed Dec. 17, 2012.
Broughton et al., Pending U.S. Appl. No. 13/716,503, filed Dec. 17, 2012.
Broughton et al., Pending U.S. Appl. No. 13/716,516, filed Dec. 17, 2012.
Fitt et al., U.S. Appl. No. 13/792,851, filed Mar. 11, 2013.
Oct. 29, 2015 Office Action issued in Chinese Application No. 201210599254.0.
Feb. 16, 2016 Office Action issued in U.S. Appl. No. 13/716,503.
Sep. 4, 2015 Office Action issued in U.S. Appl. No. 13/716,503.
Dec. 1, 2015 Office Action issued in U.S. Appl. No. 13/716,808.
Jun. 10, 2016 Office Action Issued in U.S. Appl. No. 13/716,503.
Aug. 11, 2016 Office Action Issued in U.S. Appl. No. 13/716,808.
Apr. 8, 2016 Office Action issued in U.S. Appl. No. 13/716,497.
Apr. 22, 2016 Office Action issued in U.S. Appl. No. 14/100,745.
Apr. 22, 2016 Office Action issued in U.S. Appl. No. 13/716,808.
Dec. 2, 2016 Office Action issued in U.S. Appl. No. 13/716,503.
Oct. 28, 2016 Office Action Issued in U.S. Appl. No. 14/100,745.
Translation of Oct. 12, 2016 Office Action issued in Russian Patent Application No. 2012154565.
Apr. 10, 2017 Search Report issued in European Patent Application No. 12197394.
Jan. 20, 2017 Office Action issued in U.S. Appl. No. 13/716,808.
Sep. 23, 2016 Office Action Issued in U.S. Appl. No. 13/716,497.
Apr. 6, 2015 Office Action issued in U.S. Appl. No. 13/716,648.

* cited by examiner

GAS TURBINE ENGINE SYSTEMS

CROSS-REFERENCE TO RELATED APPLICATIONS

This application is based upon and claims the benefit of priority from British Patent Application Numbers GB1122140.5 filed 22 Dec. 2011, GB1122143.9 filed 22 Dec. 2011, and GB1203991.3 filed 7 Mar. 2012, the entire contents of which are incorporated by reference.

BACKGROUND OF THE INVENTION

1. Field of the Invention

This invention relates to apparatus and methods for attaching components/systems to a gas turbine engine. In particular, the invention relates to a rigid raft assembly for carrying fluid components/systems of a gas turbine engine.

2. Description of the Related Art

A typical gas turbine engine comprises a number of components and/or systems that need to be attached thereto in order for the gas turbine engine to function in the intended manner. Such systems and/or components include, for example, fluid systems, electrical systems, monitoring systems and various electronic control units. These systems/components may be referred to as auxiliary (or ancillary) components/systems, and/or as engine dressings.

By way of example, FIG. 1 of the accompanying drawings shows a typical gas turbine engine including two conventional wiring harnesses 102, 104, each provided with a respective connector component 106, 108 for connection to circuitry, which may be for example accommodated within the airframe of an aircraft in which the engine is installed. A conventional gas turbine engine such as that shown in FIG. 1 may also comprise a number of fluid pipes 116. Such fluid pipes 116, which may be for carrying any suitable fluid, such as liquid, gas or a combination thereof, may be mounted to the engine at available locations.

Such fluid and/or electrical systems/components are conventionally mounted directly to the engine, often using a plurality of separate mounts or brackets for each system/component. Thus, the various systems/components conventionally form a complex array of pipes, leads, wires connectors and other components, each of which typically requires individually mounting.

With regard to the electrical system, a typical gas turbine engine such as that shown in FIG. 1 has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered (supplied, for example, by a fluid system mounted on the gas turbine engine), but controlled by electrical signals.

Electrical power, and signals to and from the individual electrical components, are commonly transmitted along conductors. Conventionally, such conductors may be in the form of wires and cables which are assembled together in the harness 102, 104. In such a conventional harness 102, 104, each wire may be surrounded by an insulating sleeve, which may be braided or have a braided cover. Each conventional harness 102, 104 therefore comprises a multitude of insulated wires and cables. This makes the conventional harness bulky, heavy and difficult to manipulate.

With regard to the fluid systems, these may conventionally comprise fluid pipes 116 provided to the engine, for example in spaces between the electrical harnesses. The fluid pipes 116 may have separate mounts/attachments to the gas turbine engine. The fluid pipes 116, for example in combination with other engine dressings, such as the electrical systems, occupy significant space within a gas turbine engine (for example within the nacelle of a gas turbine engine), and thus may compromise the design of the engine/aircraft, for example the size and/or weight and/or shape of the nacelle.

Thus, the complex arrangement of conventional engine dressings may be difficult and time consuming to assemble/manipulate, heavy, and/or bulky.

Furthermore, because conventional engine dressings (including, for example the electrical and fluid systems) comprise a large number of components, including various individual wires and/or bundles of wires, pipes, supporting components (such as brackets or cables) and electrical and/or mechanical connectors, the assembly/disassembly process is complicated (and thus susceptible to errors) and/or time consuming. Thus, in many build and maintenance (or repair or overhaul) procedures on a gas turbine engine, removal and subsequent refitting of the conventional engine dressings may account for a very significant portion of the operation time and/or account for a significant proportion of the potential assembly errors.

Still further, the conventional dressings, such as the fluid pipes and/or the electrical conductors in the conventional harnesses, may be susceptible to mechanical damage. For example, mechanical damage may occur during installation (due to exposed components and/or complicated assembly procedures) and/or during service (for example due to vibration and/or due to being exposed to the rest of the engine). In order to reduce the likelihood of damage to the conductors in a conventional electrical harness and/or to conventional fluid pipes, protection such as sleeves/braiding may need to be reinforced/provided, adding still further weight and is reducing the ease with which they can be manipulated.

OBJECTS AND SUMMARY OF THE INVENTION

According to an aspect of the invention, there is provided a rigid raft assembly for a gas turbine engine. The rigid raft assembly comprises a rigid material. The rigid material carries (for example supports and/or comprises and/or includes) at least a part of a first gas turbine engine system. The first gas turbine engine system is a fluid system that comprises at least one fluid passage that is at least partially embedded in the rigid raft assembly (for example in the rigid material). The rigid raft assembly also carries at least a part of a second gas turbine engine system.

This arrangement allows a fluid system to be securely mounted to a gas turbine engine in a straightforward manner. By combining the fluid system with another gas turbine engine system, a single set of mounts/fixings can be used to mount/fix part or all of more than one system to the gas turbine engine. In other words, only the fixings/mounts for the rigid raft assembly are required. Thus, by incorporating more than one system of the gas turbine engine into a rigid raft assembly, the number and/or complexity of mounts/fixings required to attach the systems to the engine (which may be referred to as dressing the engine) can be reduced. Reducing the number and/or complexity of the fixings required to dress the engine may reduce cost and/or reduce weight and/or reduce space requirement and/or reduce the time taken to dress/assemble the engine. The assembly (at least the dressing) of the engine can be simplified. This may reduce the possibility of errors occurring during assembly and/or further reduce the time required to attach the systems to the engine. These advantages also apply during engine disassembly, and thus the arrangement is particularly advantageous during engine service/maintenance.

The rigid raft assembly may comprise at least a part of at least two systems, for example 3, 4, 5, more than 5, for example at least 10 systems. In this regard, the term system includes components of the gas turbine engine.

At least a part (for example some or all) of the rigid material may be in the form of a rigid raft. Such a rigid raft may be a thin element having an upper major surface separated by a thickness from a lower major surface. The first and/or second gas turbine engine system may be carried on (for example at least partially embedded in and/or mounted on) such a rigid raft. As such, the or each fluid passage may be at least partially (for example totally) embedded between the upper and lower major surfaces of such a rigid raft formed by the rigid material.

The fluid passage(s) may be arranged to carry any fluid (liquid, gas or combination thereof), for example any fluid that requires distributing around gas turbine engine. Examples of fluids that may be carried by the fluid passage(s) include: air (e.g. cooling, sealing, and/or pneumatic air); lubricants (such as oil); fuel and/or hydraulic fluid. The rigid raft assembly may carry a plurality of fluid passages. In that case, each fluid passage may carry the same fluid or a different fluid. The rigid raft assembly may therefore comprise at least a part of one or more than one fluid system.

The rigid material may carry the first and/or second gas turbine engine systems in any appropriate manner. For example at least a part of the fluid passage is embedded in the rigid raft assembly. This may mean that, once assembled, the fluid passage is fixed relative to the rest of the rigid raft assembly. This may mean that the fluid passage can be assembled to/removed from the rest of the engine simply by attaching/removing the rigid raft assembly. Such an arrangement may ensure that the fluid passage is always in the correct position relative to the raft assembly (and thus relative to the neighbouring/connecting systems/components of the engine), for example after disassembly/reassembly during maintenance/servicing. Such an embedded fluid passage may thus be lighter and/or easier to assemble and/or have better protection and/or be more compact than conventional arrangements.

Other systems/components may also be at least partially embedded in the rigid raft assembly (for example in the rigid material). Alternatively, the systems may be carried by the rigid material (for example by a rigid raft) in any other way, for example using any other mounting method, such as using bespoke and/or conventional mountings/brackets.

The second gas turbine engine system may be any system, such as another fluid system or an electrical system. Such an electrical system may comprise electrical conductors embedded in the rigid material. Thus, the rigid raft assembly may comprise an electrical rigid raft, which may be referred to as an electrical harness raft, for example because it may form at least a part of an electrical harness. The electrical conductors may be configured to conduct any type of electrical signal (for example control and/or power signals).

At least one of the electrical conductors embedded in the electrical harness raft may be an electrically conductive wire. The or each electrically conductive wire may be surrounded by an electrically insulating sleeve. As such, individual wires may be laid into (or embedded in) the electrical harness raft, and each wire may be used to transfer one or more electrical signals through the raft and around the engine. Providing a sleeve to the individual wires may provide extra mechanical and/or electrical protection/isolation.

Additionally or alternatively, at least some (for example a plurality) of the electrical conductors may be provided in a flexible printed circuit. Thus, at least some of the electrical conductors may be provided as electrically conductive tracks in a flexible substrate. The flexible printed circuit may be flexible before being embedded in the rigid material.

Providing the electrical conductors as tracks in a flexible printed circuit may allow the size of the resulting electrical harness raft to be reduced further and/or substantially minimized. For example, many different electrical conductors may be laid into a flexible printed circuit in close proximity, thereby providing a compact structure. The flexible substrate of a single flexible printed circuit may provide electrical and/or mechanical protection/isolation to a large number of electrical conductors.

It will be appreciated that embedded electrical conductors (whether they are provided as embedded electrical wires or as conductive tracks in a flexible printed circuit embedded in the rigid material) may be described as being fixed in position by the rigid material, for example relative to the rest of the electrical harness raft. It will also be appreciated that embedded electrical conductors may be said to be surrounded by the rigid material and/or buried in the rigid material and/or integral with (or integrated into) the rigid material.

Incorporating both electrical conductors for an electrical system and a fluid passageway for a fluid system into a single rigid raft assembly may be particularly convenient arrangement, for example allowing parts of both systems to be attached to an engine using a single raft. Removing the need to have a conventional electrical harness, or reducing the size of the conventional electrical harness, by incorporating electrical conductors into a rigid raft may have considerable additional benefits, for example in terms of weight, size (packaging), mechanical protection and/or ease and/or time of assembly.

The rigid raft assembly may have an electronic control unit (ECU) mounted thereon. The ECU may be, or may form at least a part of, the second gas turbine engine system. Such an ECU may be an electronic engine controller (EEC). The rigid raft assembly may provide a convenient surface on which to mechanically mount such an ECU/EEC. Where the rigid raft assembly comprises electrical conductors embedded in the rigid material, it may be provided with (for example have embedded therein) an electrical connector/socket that can be connected to a corresponding (or complimentary) connector on an ECU/EEC which may be physically mounted on the rigid material of the rigid raft assembly. Thus, the rigid raft assembly may provide a convenient, compact, and lightweight solution for mounting and/or connecting ECUs/EECs to the engine, and/or for electrically connecting the EEC/ECU to one or more electrical conductors that may optionally be embedded in the rigid material.

The fluid passage may be said to have an axial direction along which, in use, fluid flows. The rigid material may be arranged to surround the fluid passage over at least one axial portion of the passage. As such, embedding the fluid passage in the rigid raft assembly may involve completely surrounding the perimeter of the passage over at least a part (for example some or all) of its axial length through the rigid raft assembly. Such an arrangement may be an effective way of immobilizing the pipe relative to the raft assembly. Additionally or alternatively, the fluid passageway may be protected (for example from damage) by the rigid material in the axial regions that are surrounded by the rigid material.

The fluid passage may be formed by a fluid pipe that is at least partially embedded in the rigid raft assembly. The fluid pipe may be rigid or flexible prior to being embedded in the rigid material. Thus, manufacture of the rigid raft may comprise forming the rigid material around a pre-shaped and/or (pre-formed) pipe. This may allow the shape and/or size (for example cross-sectional area) of the fluid passageway to be accurately set and determined, for example in advance of becoming part of the raft assembly by being embedded therein. Additionally or alternatively, it may provide a straightforward assembly procedure.

Such a fluid pipe may be manufactured using any suitable material. Purely by way of example only, such materials include plastics (such as PTFE and PEEK), metals (such as stainless steel or titanium) and composites (such as glass or carbon epoxy).

The fluid passage may be formed by (or in) the rigid material. Such an arrangement may not require a separate fluid pipe to be provided and embedded in the rigid raft assembly. This may further reduce the weight and/or size of the rigid raft assembly, together with reducing the number of components that the rigid raft assembly comprises.

The fluid passage may have a coating on the wetted surface(s), i.e. the surface(s) that are contacted by the fluid in use. For example, a coating may be applied in embodiments in which the fluid passage is formed in or by the rigid material. Purely by way of example only, such coatings may include polymer coatings.

The rigid raft assembly may comprise two rigid rafts formed by the rigid material. In an embodiment comprising a fluid pipe, the fluid pipe may be embedded between the two rigid rafts. Such an arrangement may be straightforward to manufacture. For example, the rigid rafts and the fluid pipe(s) could be manufactured separately from each other, and then assembled (for example bonded) together.

Each of the rigid rafts may be a thin element having an upper major surface separated by a thickness from a lower major surface. The fluid pipe may be located between the upper major surface of one raft and the lower major surface of the other raft. Such an arrangement may be straightforward to manufacture and assemble. The resulting rigid raft assembly may be particularly stiff and/or provide good protection to the embedded fluid pipe. Two or more pipes could be laid side-by-side between the two rafts, resulting in a compact arrangement for carrying multiple fluid pipes in a rigid raft assembly.

Two or more pipes may be laid side-by-side, for example, if the fluid pipe(s) has a cross-section that is narrower than the width of the rigid rafts. Alternatively (or additionally), if the fluid pipe(s) has a cross-section that is narrower than the width of the rigid rafts (i.e. narrower than the extent of upper and lower major surfaces of the rafts between which it is located), at least a part of the space between the upper major surface of one raft and the lower major surface of the other raft may be filled is with a honeycomb structure. Such a structure may be lightweight and strong, for example it may have a very high stiffness to weight ratio.

Rather than placing the fluid pipe between the upper major surface of one raft and the lower major surface of the other raft, the rigid rafts may be placed side-by-side with a gap between the respective major surfaces, but substantially no gap in the thickness direction, and the fluid pipe may be located in the gap between the rigid rafts. This may result in a particularly thin rigid raft assembly. For example, the thickness of the rigid raft assembly may be no greater than the height of the pipe itself (for example the diameter of the pipe in the case that it has a circular cross-section).

The rafts may include fixings, such as extensions, or claws, to hold the fluid pipe in position.

Any suitable material may be used for the rigid material. For example, the rigid material may be a rigid composite material, for example an organic matrix composite. Such a rigid composite material may be particularly stiff and/or lightweight. Thus, a rigid composite raft may be used that has suitable mechanical properties, whilst being thin and lightweight, for example compared with some other materials. The rigid composite material may comprise a fibre and resin structure.

Any suitable fibres may be used, such as carbon fibres, glass fibres, aramid fibres, and/or para-aramid fibres. The fibres may be of any type, such as woven and/or chopped. Any suitable resin may be used, such as epoxy, BMI (bismaleimide), PEEK, PTFE, and/or nylon.

The rigid raft assembly may further comprise a fluid connector in fluid communication with the fluid passage. The fluid connector may be arranged to connect to a complimentary fluid connector. The fluid connector may be embedded in the rigid material so as to be fixed relative to the rigid material. The fluid connector could be any type of fluid connector, for example a male fluid connector, a female fluid connector, or a connector with a flange arranged to abut another flange.

Providing the rigid raft assembly with a connector (or more than one connector) may further simplify the assembly of the gas turbine engine and/or may further reduce the part count involved in the assembly. For example, the rigid raft assembly and the fluid connector could be assembled prior to engine assembly, and provided as a single unit at the engine assembly stage. Embedding the fluid connector in the rigid raft may help to ensure that the connector is always in the correct position (and/or orientation) when the raft is provided for assembly with the rest of the engine.

A gas turbine engine may comprise (at least) two rigid raft assemblies as described herein. The respective fluid passages of the two rigid raft assemblies may be fluidly connected via respective connectors. According to this arrangement, no additional parts may be required to connect the fluid passageways of two raft assemblies together, for example if the two connectors are complimentary. This may further reduce the number of operations required to attach the rigid raft assembly, and thus the fluid system(s), to the gas turbine engine. Thus, such an arrangement may, for example, reduce part count and/or weight and/or engine assembly time/complexity.

Where the gas turbine engine includes (at least) two rigid raft assemblies as described herein, they may both comprise electrical conductors, for example in the form of electrical harness rafts. In that case, the electrical conductors, for example in electrical harness rafts, may be connected together. The electrical conductors may be connected together using complimentary connectors provided to the respective raft (for example embedded in the raft). This may be desirable, for example, if the two rigid raft assemblies are placed adjacent each other. Alternatively or additionally, the electrical connectors may be connected together using at least one flexible cable. This may be desirable, for example, if there is a gap between the rigid raft assemblies when they are installed on the engine and/or if they vibrate relative to each other. The flexible cable may take any suitable form, for example a flexible printed circuit as described elsewhere herein. The flexible cable may be used to connect an electrical harness raft assembly to another electrical component.

Accordingly, there is provided (and aspects of the invention may be used with/as a part of) a gas turbine engine comprising an electrical system arranged to transfer electrical signals around the engine installation. The electrical system comprises a rigid raft in the form of an electrical harness raft comprising multiple electrical conductors embedded in a rigid material, the electrical harness raft forming a first engine installation component. The electrical system also comprises a second engine installation component comprising electrical conductors, which may be a second rigid raft in the form of an electrical harness raft. The electrical system also comprises at least one flexible cable connected between the electrical harness raft and the second engine installation component so as to electrically connect electrical conductors of the electrical harness raft with electrical conductors of the second engine installation component.

The gas turbine engine may comprise a non-embedded fluid pipe that is not embedded in a rigid raft assembly. The non-embedded fluid pipe may have a complimentary connector connected to the fluid connector of the raft assembly, thereby fluidly connecting the fluid pipe and the fluid passageway in the raft assembly. The non-embedded fluid pipe may allow fluid passages of two rigid raft assemblies that are not necessarily in close proximity to be connected together. Different non-embedded fluid pipes may be provided depending on the relative positions of the two rigid raft assemblies to be connected together. The non-embedded fluid pipes could be either flexible or rigid. Using non-embedded fluid pipes may help to accommodate any relative movement between the fluid passages of the two rigid raft assemblies being connected together, for example caused by vibration.

According to an aspect of the invention, there is provided a method of assembling (or dressing) a gas turbine engine that comprises a rigid raft assembly as described herein. The method comprises mounting at least one rigid raft assembly to the rest of the gas turbine engine. The method comprises fluidly connecting the respective fluid passageway of the or each raft assembly to another part of the fluid system.

Assembling a gas turbine engine in this way using at least one rigid raft assembly allows the engine assembly (or dressing) to be simplified. The number of engine assembly operations and/or the number of parts required for engine assembly may be reduced. The resulting assembled gas turbine engine may have any one or more of the advantages described elsewhere herein, for example in terms of weight, packaging, size, protection and/or simplicity, amongst others.

The or each (or at least one of the) rigid raft assembly/assemblies may be mounted to the gas turbine engine using at least one anti-vibration mount. Using an anti-vibration mount to attach the rigid raft assembly to the gas turbine engine may reduce (or substantially eliminate) the amount (for example the amplitude and/or the number/range of frequencies) of vibration being passed to the rigid raft assembly from the gas turbine engine, for example during use. This may help to prolong the life of the rigid raft assembly. Furthermore, any other components that may be attached to the rigid raft assembly (as discussed above and elsewhere herein) may also benefit from being mounted to the gas turbine engine via the anti-vibration mounts, through being mounted on the rigid raft assembly. This may mean that any components that would conventionally be mounted directly to the gas turbine engine and require at least a degree of vibration isolation no longer require their own dedicated anti-vibration mount. Such components may include, for example, Electronic Engine Controllers (EECs) and Engine Health Monitoring Units (EMUs). Thus, the total number of anti-vibration mounts that are required to assemble an engine may be reduced. This may still further reduce the number of parts required and/or the time taken to assemble an engine or engine installation and/or reduce the total assembled weight and/or reduce the likelihood of errors occurring during assembly.

Furthermore, components that are conventionally mounted to an engine without anti-vibration mounts (for example because of the weight and/or cost penalty), but which are now mounted to a rigid raft assembly, may benefit from vibration isolation without any weight/cost/assembly time penalty. This may reduce the possibility of damage occurring to such components and/or increase their service life. Such components may include, for example, ignitor boxes (used to provide high voltage power to engine ignitors), and pressure sensors/switches, for example for fluid systems such as oil, air, fuel, pneumatics and/or hydraulics.

According to an aspect of the invention there is provided a method of servicing a gas turbine engine as described herein, wherein the rigid raft assembly is a first rigid raft assembly. The method comprises removing the first rigid raft assembly from the gas turbine engine; and installing a second, pre-prepared, rigid raft assembly onto the gas turbine engine in place of the first raft assembly. The second rigid raft assembly may be of the same (or similar, for example upgraded) specification (for example type) as the first rigid raft assembly. The first and second rigid raft assemblies may be electrical harness raft assemblies having electrical conductors embedded in a rigid material. The electrical conductors may be at least a part of an electrical system arranged to transfer electrical signals around the engine.

Removing the first rigid raft assembly may comprise detaching a fixing (or mount or bracket) through which the first rigid raft is attached (or mounted) to the rest of the gas turbine engine. Installing the second, pre-prepared, rigid raft assembly may comprise attaching (or mounting) it to the rest of the gas turbine engine using a fixing (or mount or bracket).

Replacing a first rigid raft assembly with a pre-prepared second rigid raft assembly may significantly reduce the out-of-service time of the gas turbine engine being serviced. The second rigid raft assembly may be prepared and optionally tested, for example whilst the first rigid raft assembly is still operational on the gas turbine engine.

The step of removing the first rigid raft assembly may comprise disconnecting the respective fluid passage (which may be formed by a pipe) from another part of the fluid system (which may be referred to as a fluid transfer system). The step of installing the pre-prepared second raft assembly may comprise connecting the respective fluid passage (which may be formed by a pipe) to the other part of the fluid system.

The rigid raft assembly may be prepared before the gas turbine engine is assembled or dressed. Thus, according to an aspect, there is provided a method of dressing a gas turbine engine comprising preparing a rigid raft assembly as described herein in accordance with the invention for installing on the gas turbine engine and storing the prepared rigid raft assembly in a storage facility. When the gas turbine engine requires dressing, the method comprises installing the prepared rigid raft assembly on the rest of the gas turbine engine. The prepared rigid raft assembly may thus form at least a part of the engine dressing.

The rigid raft assembly may be provided to any part of the gas turbine engine, for example to the fan casing and/or core casing and/or engine birfurcation (or splitter) passing across the bypass duct of a turbofan engine. The rigid raft assembly may be shaped to correspond to the component to which it is attached, for example to a portion of an outer surface of a fan casing to which they are mounted. As mentioned elsewhere herein, a gas turbine engine may be provided with more than one rigid raft assembly.

BRIEF DESCRIPTION OF THE DRAWINGS

The invention will now be described, by way of example only, with reference to the accompanying Figures, in which.

DETAILED DESCRIPTION OF THE PREFERRED EMBODIMENTS

Figure 1:
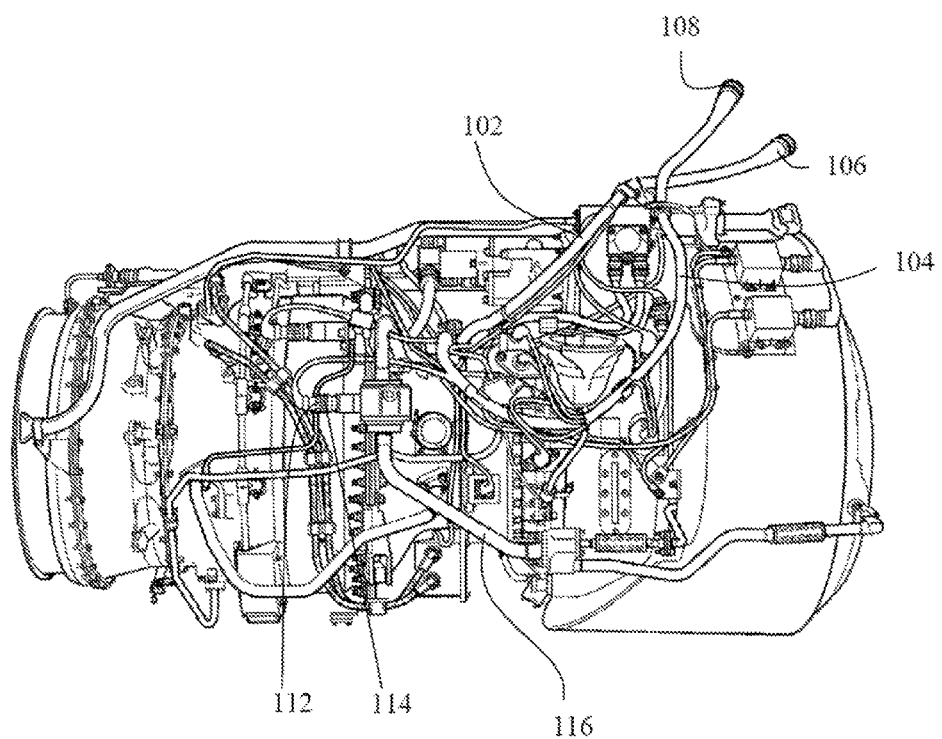
FIG. 1 shows a gas turbine engine with conventional fluid pipes and electrical harnesses.
Figure 2:
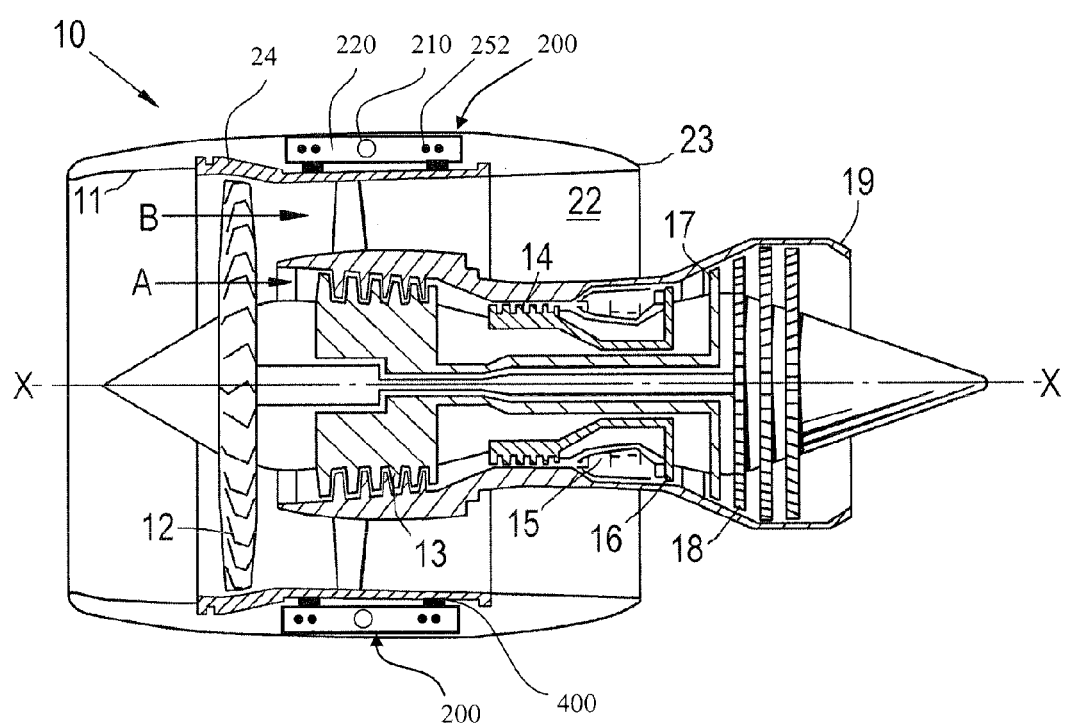
FIG. 2 shows a cross-section through a gas turbine engine having a rigid raft assembly in accordance with the present invention.

With reference to FIG. 2, a ducted fan gas turbine engine generally indicated at 10 has a principal and rotational axis X-X. The engine 10 comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. The engine also has a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive, the high, intermediate and low-pressure turbines 16, 17, 18 before being exhausted through the nozzle 19 to provide additional propulsive thrust. The high, intermediate and low-pressure turbines 16, 17, 18 respectively drive the high and intermediate pressure compressors 14, 13 and the fan 12 by suitable interconnecting shafts.

The gas turbine engine 10 shown in FIG. 2 may be at least a part of a gas turbine engine or gas turbine engine installation according to the present invention. The gas turbine engine 10 comprises at least one rigid raft assembly 200. The rigid raft is assembly 200 comprises a fluid passage 210. The fluid passage 210 is embedded in the rigid raft assembly 200 in FIG. 2. In particular, the fluid passage 210 is at least partially embedded in a rigid material 220. The rigid raft assembly 200 thus forms a single unit in which a fluid passage 210 is immobilized relative to the rest of the rigid raft assembly 200.

The fluid passage 210 is part of a fluid system that provides fluid to components of the gas turbine engine 10 and/or transports fluid around the gas turbine engine 10. The fluid system is a part of the gas turbine engine 10.

The rigid raft assembly 200 of FIG. 2 is also provided with electrical conductors 252. In FIG. 2, the electrical conductors 252 are also embedded in the rigid raft assembly 200, in particular in the rigid material 220. The electrical conductors 252 form part of an electrical system that transfers electrical signals to components of the gas turbine engine 10 and/or around the gas turbine engine 10. The electrical system is part of the gas turbine engine 10.

The rigid raft assembly (or assemblies) 200 is attached to the rest of the gas turbine engine 10 using mounts 400, which may be anti-vibration (AV) mounts.

In FIG. 2, a rigid raft assembly 200 is shown in cross-section at diametrically opposite positions around the engine 10. The two cross-sections through the rigid raft assembly 200 in FIG. 2 may be part of the same rigid raft assembly 200, or part of different rigid raft assemblies 200. The rigid raft assembly or assemblies 200 may have various specifications/constructions. FIGS. 3 to 8, described in more detail below, give examples of possible rigid raft assemblies 200. It will be appreciated that the present invention may also relate to many other specifications and/or constructions of rigid raft assembly 200 other than those shown in, and described in relation to, FIGS. 3 to 8.

Figure 3:
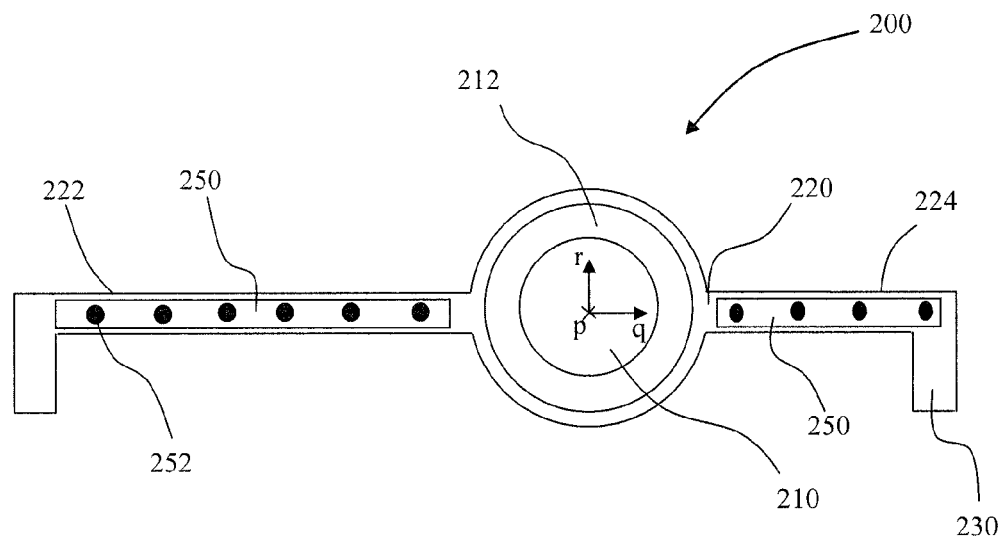
FIG. 3 shows a schematic of an example of a rigid raft assembly according to the present invention.

FIG. 3 shows an example of a rigid raft assembly 200 in accordance with the present invention. In FIG. 3, the fluid passage 210 is formed using a pipe, or conduit, 212. Any suitable material could be used to form the pipe 212, such as, by way of example only, any suitable plastic, metallic, fibre and/or composite material. The fluid pipe 212, and the passageway 210 that it forms, are part of a fluid system of the gas turbine engine. This may be any type of fluid system, such as, by way of example only, those referred to elsewhere herein.

In the cross section shown in FIG. 3, the pipe 212 is surrounded by a rigid material 220. The rigid material 220 may be any suitable rigid material, such as a rigid plastic and/or rigid composite material. The rigid composite material may be of any suitable material/construction, such as those given by way of example elsewhere herein. The pipe 212, and thus the fluid passage 210, is thus embedded in the rigid material 220.

The rigid material 220 forms rigid rafts 222, 224. The rigid rafts 222, 224 may be considered to be a single rigid raft within which the pipe 212 is embedded. Alternatively, the rigid rafts 222, 224 may be considered to be separate individual rafts between which the pipe 212 is embedded.

The rigid raft assembly 200 comprises at least a part of another gas turbine engine system. In the FIG. 3 example, the rigid rafts 222, 224 have electrical conductors 252 embedded therein. As such, the rigid raft assembly 200 of FIG. 2 comprises at least a part of an electrical system of the gas turbine engine 10. However, the rigid raft assembly 200 shown in FIG. 3 (or indeed in any embodiment) may alternatively or additionally comprise at least a part of any other gas turbine engine system in addition to the fluid system.

The electrical conductors 252 in FIG. 2 are part of a flexible printed circuit, or flexible printed circuit board (FPCB) 250. An example of such an FPCB is described below in relation to FIGS. 9 and 10. Any suitable number of FPCBs could be laid in the rigid rafts 222, 224 in any arrangement. For example, a plurality of FPCBs may be offset from each other in the thickness direction (labelled r in FIG. 3). Although separate FPCBs are shown as being embedded either side of the fluid passage 210, this need not be the case. Any suitable arrangement of FPCBs could be used. For example, the FPCBs could extend over (or around) the fluid passage 210 (and thus over the pipe 212 in the FIG. 2 example). The electrical conductors 252 may be provided in any suitable form. For example, they could be laid or formed as tracks or wires directly into the rigid raft 222, 224, as described in more detail in relation to FIG. 6.

The rigid raft assembly 200 in FIG. 3 also comprises stiffening ribs 230. These stiffening ribs 230 may be formed from the same rigid material 220 as used to form the rigid rafts 222, 224, or from a different material. The ribs 230 may be formed integrally with the rafts 222, 224, or may be formed separately and attached during construction of the raft assembly 200. The stiffening ribs 230 may not be required at all, and may not be present. The ribs 230 may be particularly useful if, for example, the rigid rafts 222, 224 are particularly thin (in the thickness direction r) and/or wide. The ribs 230 may extend in any direction as required, such as in the axial direction p (as shown in FIG. 3), the width direction q, or any other direction, for example in the axial-width (p-q) plane.

The fluid passageway 210 has an axial direction p along which fluid generally flows. In FIG. 2, the axial direction p is into the page, i.e. perpendicular to the thickness direction r and the width direction q. In embodiments in which the fluid passageway 210 is formed using a pipe 212 (such as that shown in FIG. 3), the pipe 212 may be embedded in the rigid material over substantially the whole axial length of the pipe 212 in the axial direction p, or only over a portion of the axial length.

Figure 4:
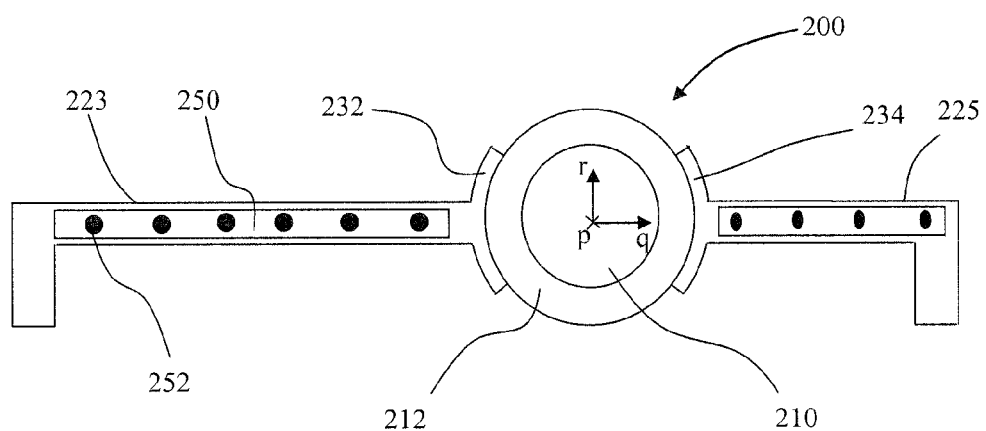
FIG. 4 shows a schematic of an example of a rigid raft assembly according to the present invention.

In FIG. 3, the fluid passage 210 is completely surrounded by the rigid material 220 over at least the cross section shown in the figure, and thus over at least a portion of its axial length. In other words, at least a part of the rigid material 220 may extend around a perimeter of the fluid pipe 212 without gaps. However, where the term "embedded" (or derivatives thereof) is used herein in relation to the fluid passage 210, this does not necessarily require the fluid passage 210 to be completely surrounded by the rigid material 220 over any portion (although in some cases it may be). For example, as shown in FIG. 4, the fluid passage 210 may be formed by a fluid pipe 212 located between two rafts 223, 225, but not surrounded by the rigid material. In other words, there may be a part of the perimeter of the fluid pipe 212 that is not enclosed by the rigid material, which may be referred to as a circumferential gap in the rigid material 220 (in the case of a fluid pipe 212 with a circular cross section).

The two rigid rafts 223, 225 in the FIG. 4 example are separated from each other in the width (q) direction of the rigid raft assembly 200. In FIG. 4, the fluid pipe 212 is held in place between the two rafts 223, 225 using two claws 232, 234, each of which extends from a respective raft 223, 225. In this way, the fluid pipe 212, and thus the fluid passage 210 formed by the fluid pipe 212, may be embedded in the rigid raft assembly 200. Each claw 232, 234 may be formed integrally with and/or from the same rigid material 220 as the respective rigid raft 223, 225. Alternatively, each claw may be manufactured separately from the respective raft 223, 225 and/or may be manufactured using a different material.

Figure 5:
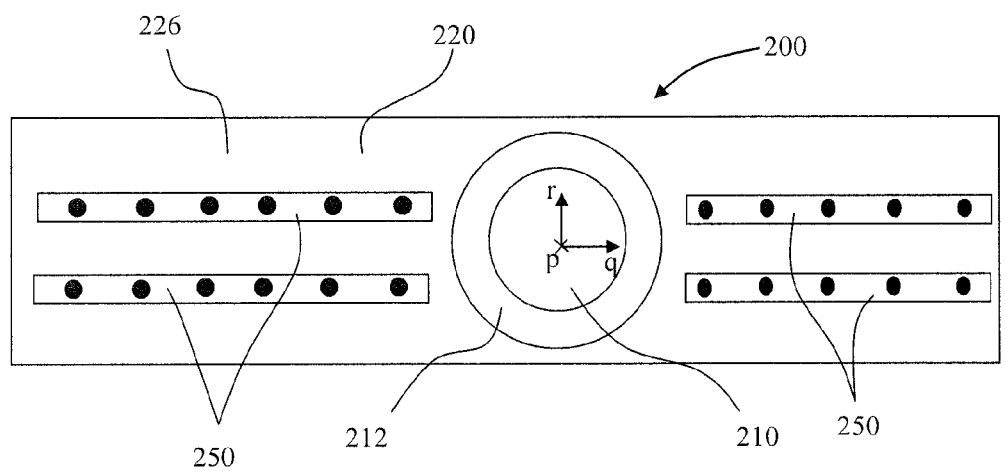
FIG. 5 shows a schematic of an example of a rigid raft assembly according to the present invention.

In the embodiment shown in FIG. 5, the rigid material 220 forms a thicker (in the r direction) rigid raft 226. In the FIG. 5 embodiment, the raft 226 is thicker than the outer diameter of the fluid pipe 212, for example across the whole width of the raft 226. Thus, the rigid raft assembly 200 is thicker than the fluid pipe 212 (and thus the fluid passageway 210) across the full width (in the q direction). The rigid raft assembly 200 of FIG. 5 may be a stiffer shape than the rigid raft assembly 200 of FIG. 3 or FIG. 4. Additionally or alternatively, the additional thickness of the FIG. 5 rigid raft assembly may enable different and/or more gas turbine systems to be provided thereto, for example embedded in the rigid raft 222.

Figure 6:
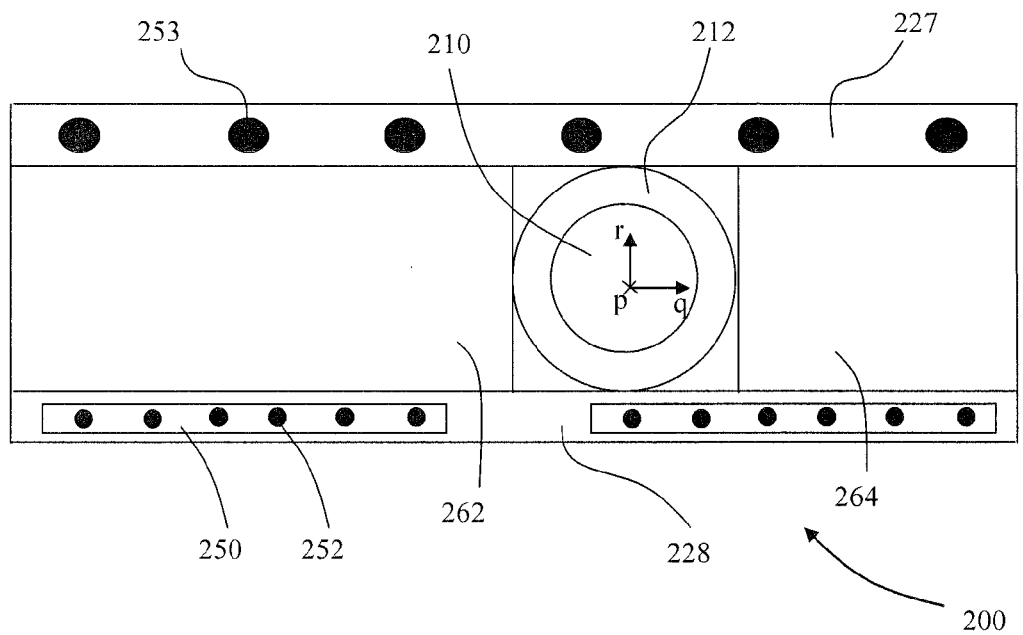
FIG. 6 shows a schematic of an example of a rigid raft assembly according to the present invention.

FIG. 6 shows a still further example of a rigid raft assembly 200 for use with the present invention. In the rigid raft assembly 200 of FIG. 6, the fluid passage 210 is formed between two separate rigid rafts 227, 228. In this way, the fluid passage 210 formed by the fluid pipe 212 is embedded in the rigid raft assembly 220. The two rigid rafts 227, 228 in the FIG. 6 example are separated from each other in the thickness (r) direction of the rigid raft assembly 200. The fluid pipe 212 in FIG. 6 is narrower (in the q direction) than the rigid rafts 227, 228 (although in other embodiments this need not be the case). At least some of the space between the rigid rafts 227, 228 that is not occupied by the fluid pipe 212 may be filled with a suitable material 262, 264. This material may be chosen to have any desired property, such as low density (and thus weight) and/or high strength. For example, the material 262, 264 may be a honeycomb construction of any suitable material, such as, by way of non-limitative example only, metal, plastic or composite.

The rigid raft assembly 200 of FIG. 6 comprises electrical conductors 252, 253. Some of the electrical conductors 252 are embedded in an FPCB 250 embedded in the lower rigid raft 228. Other conductors 253 are embedded directly into the upper rigid raft 227. The conductors 253 that are embedded directly into the rigid raft 227 may optionally be sheathed or coated, for example a protective and/or insulative sleeve or coating. Any embodiment that includes electrical conductors in the rigid raft assembly 200 may have any combination of conductors 253 embedded directly in the raft (with or without sheath/coating) and conductors 252 embedded within FPCBs 250, either in the same or different rigid rafts.

Figure 7:
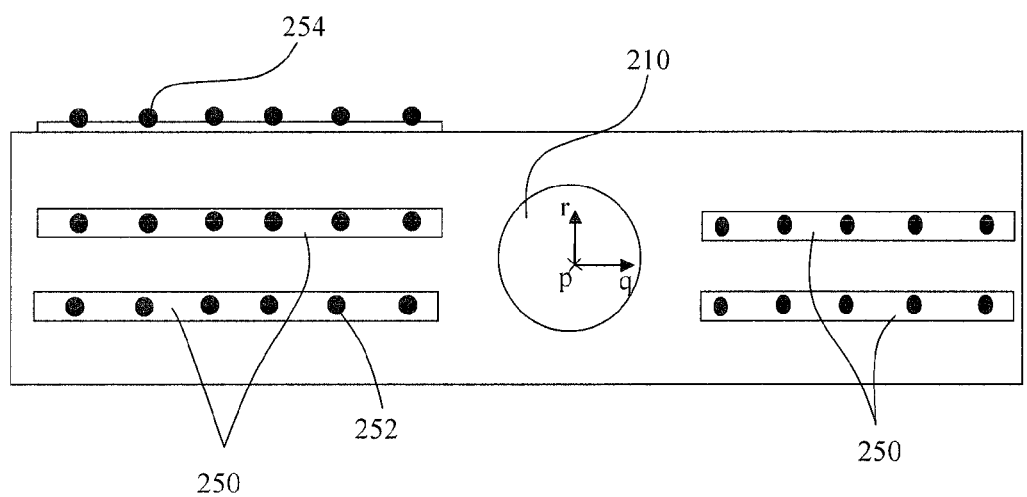
FIG. 7 shows a schematic of an example of a rigid raft assembly according to the present invention.

Indeed, further additionally or alternatively, at least some electrical conductors 252 (which, in all cases, may be considered to be, for example, electrical wires or electrical tracks) may be mounted on or to a part of the rigid raft assembly 200. An example of such an arrangement is shown in FIG. 7, which has some conductors 254 mounted on the outside of the rigid raft assembly 200. The FIG. 7 embodiment also has conductors 252 embedded in a FPCB 250, but in some embodiments the only part of an electrical system that is provided to the rigid raft assembly 200 may be mounted on an outer surface of the rigid raft assembly 200.

According to a separate feature of the FIG. 7 example, the fluid passage 210 is formed by the rigid material 220 itself. Thus, the FIG. 7 example does not include a separate fluid pipe 212. A coating may be applied to the wetted surfaces of the fluid passage 210. For example, a coating may be applied to reduce or substantially prevent any reaction with the fluid, depending on the fluid being carried.

The fluid passage 210 may be formed by the rigid material 220, rather than a fluid pipe 212 in any suitable embodiment. By way of example only, the fluid pipe 212 may not be required in some embodiments of the examples of FIG. 3, or 5 to 8.

Figure 8:
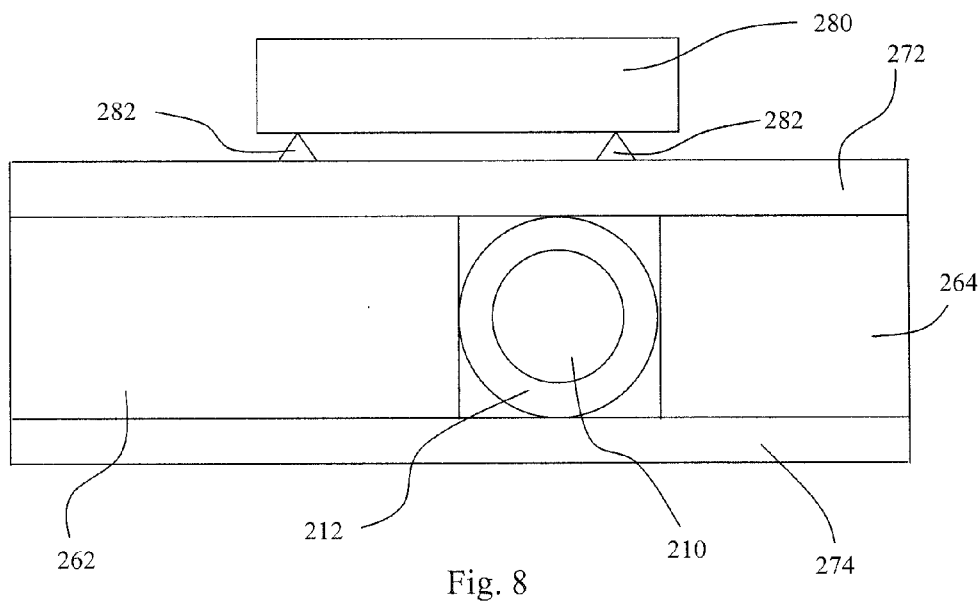
FIG. 8 shows a schematic of an example of a rigid raft assembly according to the present invention.

In the FIG. 8 example, a fluid pipe 212 is embedded in a rigid raft assembly 200 by being sandwiched between two rigid rafts 272, 274. The rigid rafts 272, 274 in the FIG. 8 arrangement do not have electrical conductors embedded therein. Otherwise, the rigid rafts may be substantially the same (for example in terms of materials and/or construction) as other rigid rafts described elsewhere herein. As with the FIG. 6 arrangement, the gap between the rigid rafts 272, 274 may be at least partially filled with another material, 262, 264, which may be as described above in relation to FIG. 6.

The rigid raft assembly 200 shown in FIG. 8 comprises a component 280, which is at least a part of a gas turbine engine system. In FIG. 8, the component 280 is mounted to one of the rafts 272. Mounts 282 could be used to attach the component 280 to the raft 272.

The component 280 could be a component of any gas turbine engine system. For example, it may be an electronic control unit (ECU), such as an Electronic Engine Controller (EEC) or an Engine Health Monitoring Unit (EMU). The component 280 may have electrical conductors attached thereto, through which it may be electrically connected with one or more other components. The component 280 may be part of an electrical system. By way of further example, the component 280 may be part of a fluid system (which may be different to the fluid system formed in part by the fluid passage 210), for example it may be a fluid pipe.

The component 280 may be, for example, part of a monitoring system, such as, by way of non-limitative example, a thermal, pressure and/or vibration monitoring system. The component 280 may be, again by way of example only, a temperature sensor, pressure sensor and/or an accelerometer. The component 280 may or may not be physically connected to another component/another part of a system of the gas turbine engine.

Rigid raft assemblies that comprise parts of a gas turbine engine system mounted on another part of the assembly (such as on a rigid raft 272, as in FIG. 8) may also comprise electrical conductors. For example, the FIG. 8 arrangement may also comprise electrical conductors 252, 253 embedded in at least one of the rigid rafts 272, 274. In that case, the component 280 (which may be an ECU, EEC, or EMU) and the raft 272 may have complimentary connectors, which may be connected together. In that way, the component 280 may be electrically connected to the conductors in the rigid raft 272.

A component such as the component 280 of FIG. 8 may be (electrically and/or mechanically) mounted to a rigid raft of the rigid raft assembly 200 in any embodiment, for example in any of the examples of FIGS. 3 to 7. Indeed, in addition to the fluid system formed at least in part by the fluid passage 210, any rigid raft assembly 200 may comprise components from any one or more (for example 2, 3, 4, 5, 6, 7, 8, 9, 10 or more than 10) gas turbine engine systems.

The cross sectional shapes of the rigid raft assemblies 200, and the components thereof, shown in the examples of FIGS. 3 to 8 are examples of the cross-sectional shapes that could be used. Any suitable regular or irregular cross-sectional shape of the rigid raft assembly 200 could be used as desired, such as, by way of example only, circular, and triangular. The rigid raft assembly 200 may comprise any number of rigid rafts, for example 1, 2, 3, 4, 5, 6, 7, 8, 9, 10 or more than 10.

In all of the examples shown in FIGS. 3 to 8, the fluid passage 10 has a circular cross-section, i.e. the flow area is circular. This may be desirable (although not necessarily essential) in some cases, for example if the fluid being carried is at a high pressure. However, the fluid passages 210 may alternatively be any suitable regular (such as polygonal) or irregular shape, such as, by way of non-limitative example, rectangular, triangular, oval, or semi-circular.

The rigid raft assemblies 200 could be any suitable/desirable shape, not only in cross-section but in all dimensions. For example, the rigid raft assemblies 200 could be shaped to correspond to (or fit onto and/or around) another part of the gas turbine engine 10, such as a casing (for example an engine core casing or an engine fan casing) or a bifurcation (or splitter) between the engine core and engine fan casing.

Figure 16:
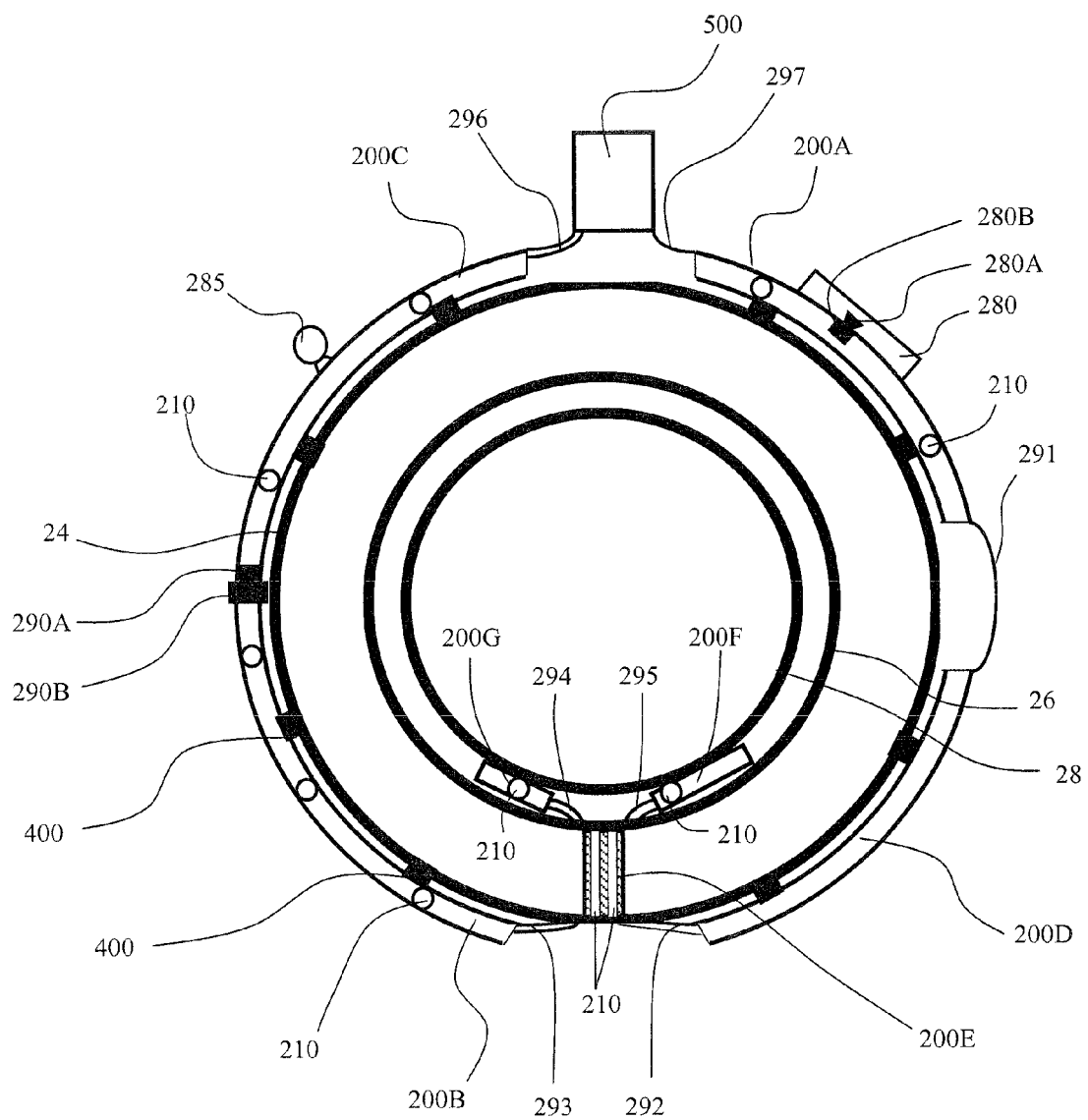
FIG. 16 shows a cross-section normal to the axial direction through a gas turbine engine according to an embodiment of the invention.

The axial direction p of the rigid raft assembly 200, which may be referred to as the flow direction p because it may correspond to the direction in which the fluid flows through the fluid passage 210, may correspond to any direction relative to the engine axes. For example, the fluid passage 210 may be substantially aligned with the circumferential direction of the engine (as shown in, for example, FIG. 2), the radial direction of the engine (for example in an embodiment that has a rigid raft assembly 200 passing through the splitter or bifurcation in the bypass flow duct 22), or the axial direction of the engine (as shown in FIG. 16, described below). The axial direction p of the rigid raft assembly 200 may be aligned with any combination of the circumferential, radial, and axial directions of the engine 10.

Figure 9:
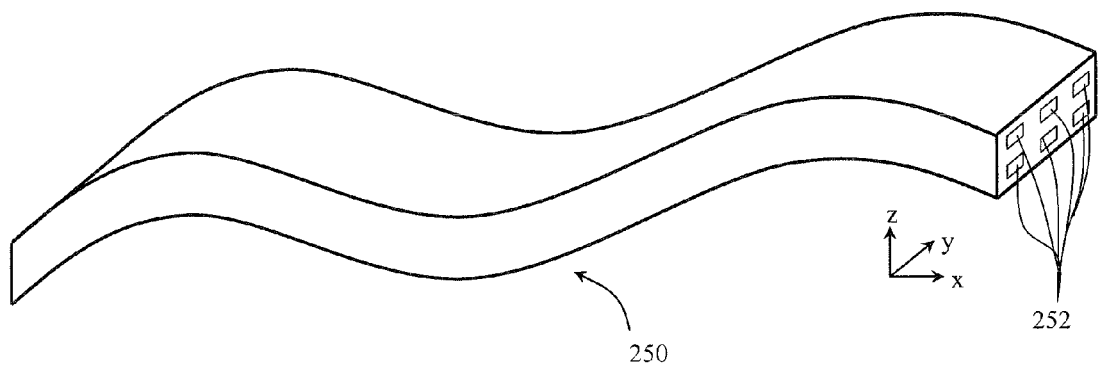
FIG. 9 shows a perspective view of a flexible printed circuit.
Figure 10:
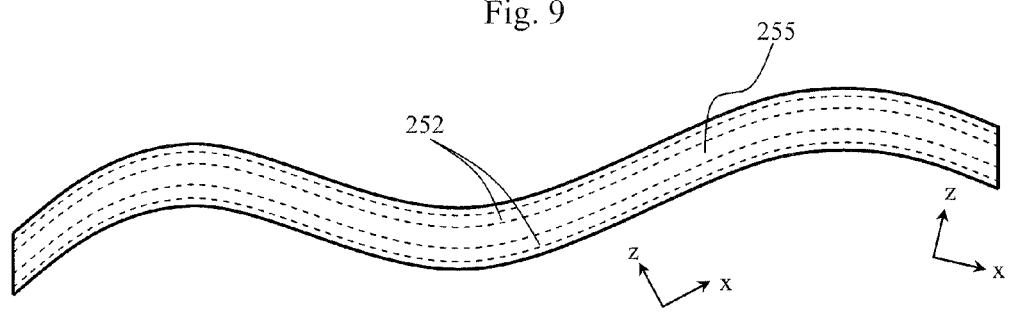
FIG. 10 shows a side view of the flexible printed circuit of FIG. 9.

As mentioned elsewhere herein, rigid raft assemblies according to the present invention may include electrical conductors 252 embedded in flexible printed circuit (FPC) 250. An example of such a FPC 250 is shown in FIGS. 9 and 10. FIG. 9 shows a perspective view of the FPC 250, and FIG. 10 shows a side view.

Such an FPC 250 may comprise a flexible (for example elastically deformable) substrate 255 with conductive tracks 252 laid/formed therein. The FPC 250 may thus be deformable. The FPC may be described as a thin, elongate member and/or as a sheet-like member. Such a thin, elongate member may have a major surface defined by a length and a width, and a thickness normal to the major surface. In the example shown in FIGS. 9 and 10, the FPC 250 may extend along a length in the x-direction, a width in the y-direction, and a thickness (or depth or height) in the z-direction. The x-direction may be defined as the axial direction of the FPC (which may or may not correspond to the axial direction p of the fluid passage 210). Thus, the x-direction (and thus the z-direction) may change along the length of the FPC 250 as the FPC is deformed. This is illustrated in FIG. 10. The x-y surface(s) (ie the surfaces formed by the x and y directions) may be said to be the major surface(s) of the FPC 250. In the example shown in FIGS. 9 and 10, the FPC is deformable in the z direction, i.e. in a direction perpendicular to the major surface. FPCs may be additionally of alternatively deformable about any other direction, and/or may be twisted about any one or more of the x, y, or z directions.

The flexible substrate 255 may be a dielectric. The substrate material may be, by way of example only, polyamide. As will be readily apparent, other suitable substrate material could alternatively be used.

The conductive tracks 252, which may be surrounded by the substrate 255, may be formed using any suitable conductive material, such as, by way of example only, copper, copper alloy, tin-plated copper (or tin-plated copper alloy), silver-plated copper (or silver-plated copper alloy), nickel-plated copper (or nickel-plated copper alloy) although other materials could alternatively be used. The conductive tracks 252 may be used to conduct/transfer electrical signals (including electrical power and electrical control signals) through the rigid raft assembly (or assemblies) 200, for example around a gas turbine engine 10 and/or to/from components of a gas turbine engine and/or an airframe attached to a gas turbine engine.

The size (for example the cross-sectional area) and/or the shape of the conductive tracks 252 may depend on the signal(s) to be transmitted through the particular conductive track 252. Thus, the shape and/or size of the individual conductive tracks 252 may or may not be uniform in a FPC 250.

The example shown in FIGS. 9 and 10 has 6 conductive tracks 252 running through the substrate 255. However, the number of conductive tracks 252 running through a substrate 255 could be fewer than 6, or greater than 6. Indeed the number of conductive tracks 252 could be far greater than 6, for example tens or hundreds of tracks, as required. As such, many electrical signals and/or power transmission lines may be incorporated into a single FPC 250.

A single FPC 250 may comprise one layer of tracks, or more than one layer of tracks, for example, 2, 3, 4, 5, 6, 7, 8, 9, 10 or more than 10 layers of tracks. An FPC may comprise significantly more than 10 layers of tracks, for example at least an order of magnitude more layers of tracks. In this regard, a layer of tracks may be defined as being a series of tracks that extend in the same x-y surface. Thus, the example shown in FIGS. 9 and 10 comprises 2 layers of tracks, with each layer comprising 3 tracks 252.

Rigid raft assemblies 200 as described and claimed herein may be manufactured using any suitable method. For example, the rigid material 220 may initially be provided as layers of flexible material, such as (by way of example only) layers of fibre and resin compound. This flexible material may be placed into a mould, for example having a desired shape. Other components (such as fluid pipes 212 and/or electrical conductors 252, 253, 254, which may be embedded in a FPC 250) may also be placed into the mould, for example between layers of the flexible material from which the rigid material 220 is ultimately formed. In rigid raft assemblies 200 in which the fluid passage 210 is formed directly in the rigid material 220, a further mould having the shape of the fluid passage 210 may be used, around which the material forming the rigid material (such as the flexible layers) may be formed. Parts of the mould may have any suitable form and/or construction, for example that could be readily removed when the rigid raft assembly 200 is formed into the desired shape.

Where fibre and resin is used in the construction, suitable treatment (for example heat and/or pressure treatment) may be used to produce the rigid material 220. The treatment may be conducted in, for example, an autoclave. Such fibre and resin compound may comprise a sheet of interwoven fibres, or strands. The strands may extend in any one or more directions as required, for example in perpendicular directions. The strands/fibres may be pre-impregnated (or "prepregged") with the resin.

Any suitable method could be used to produce the rigid raft assembly 200. For example, the strands/fibres need not be pre-impregnated with the resin. Instead, the fibres/strands could be put into position (for example relative to a fluid pipe 212) in a dry state, and then the resin could be fed (or pumped) into the mould. Such a process may be referred to as a resin transfer method. Indeed, in some constructions no fibre may be used at all in the rigid material 220.

After the treatment, the rigid raft assembly 200 may be set in the desired shape. Suitable connectors and/or sockets (which may be electrical and/or fluid connectors, such as those described elsewhere herein) may be fitted to the raft 200. Such connectors may be fitted prior to any stiffening treatment of the rigid raft assembly 200, or after such treatment. Any electrical connectors may be in electrical connection with any conductors 252, 253, 254 and may have pins or connectors for connection (electrical and/or mechanical) to other components of the gas turbine engine 10, as discussed in greater detail elsewhere herein.

FIGS. 11 to 15 show examples of possible fluid connections 310, 320, 330, 340, 350 that could be used with and/or as part of the invention. Some rigid raft assemblies 200 may be provided with a fluid connection 310, 320, 330, 340, 350 (or at least the relevant part thereof) such as one of those shown by way of example only in FIGS. 11 to 15. Other rigid raft assemblies 200 may not be provided with a fluid connection, and/or may be attached/connected to a suitable connection (for example those shown in FIGS. 11 to 15) during assembly with the rest of the engine 10. Thus any rigid raft assembly 200 according to the invention may or may not be provided with at least a part of a fluid connector for connecting the rigid raft assembly 200 to the rest of a fluid system. Rigid raft assemblies 200 that are provided with a suitable connector may have at least a part of the connector embedded in the rigid material 220, for example in the rigid raft. In rigid raft assemblies in which the fluid passage 210 is formed by a fluid pipe 212, the fluid connector may be integral with the fluid pipe 212 embedded in the rigid material 220, such that the connector and optionally a part of the pipe 212 extends from the rigid material 220 for connection to another part of the fluid system.

Figure 11:
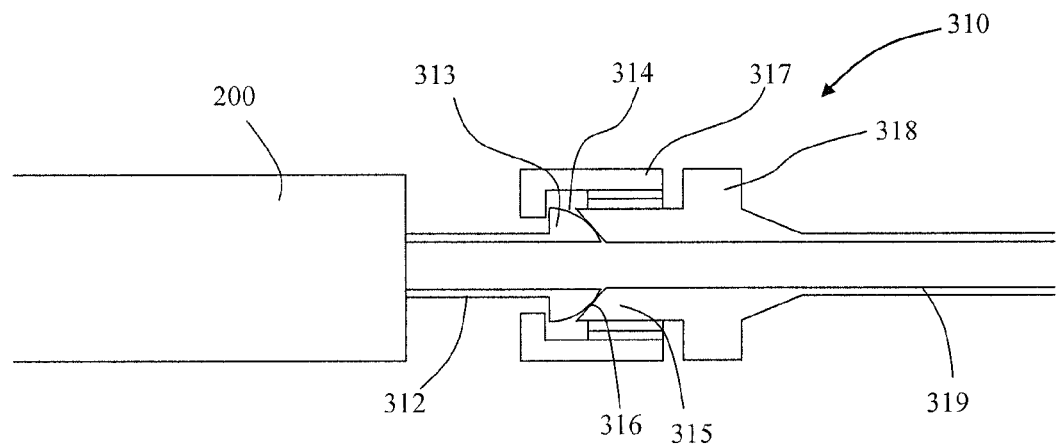
FIG. 11 shows a schematic of a fluid connection between a rigid raft assembly and a fluid pipe.

FIG. 11 shows a fluid connection 310 that fluidly connects a rigid raft assembly 200 with a fluid pipe 319. In FIG. 10, a fluid pipe 312, which may be an extension of an embedded fluid pipe 212, extends from the rigid raft assembly 200. The fluid pipe 312 terminates in a male connector 313 which may be formed as part of a hemi-spherical surface 314. The male connector 313 is received by a corresponding female connector 315. The female connector 315 may be a cone shape. The female connector 315 may be connected to another part of the fluid system, such as a fluid pipe 319.

The fluid connection 310 of FIG. 11 may have a tightening nut 317 to form a fluid tight connection between the male connector 313 and the female connector 315. The tightening nut 317 may have a corresponding control feature 318, such as a flange, to prevent over-tightening. In an arrangement such as that of FIG. 11, the tightening nut 317 may be provided to the rigid raft side of the connector 310, so as to try to ensure that any damage due to over-tightening is caused to the pipe 319 in preference to the raft side of the connector, which may be relatively more expensive to repair/replace.

Figure 12:
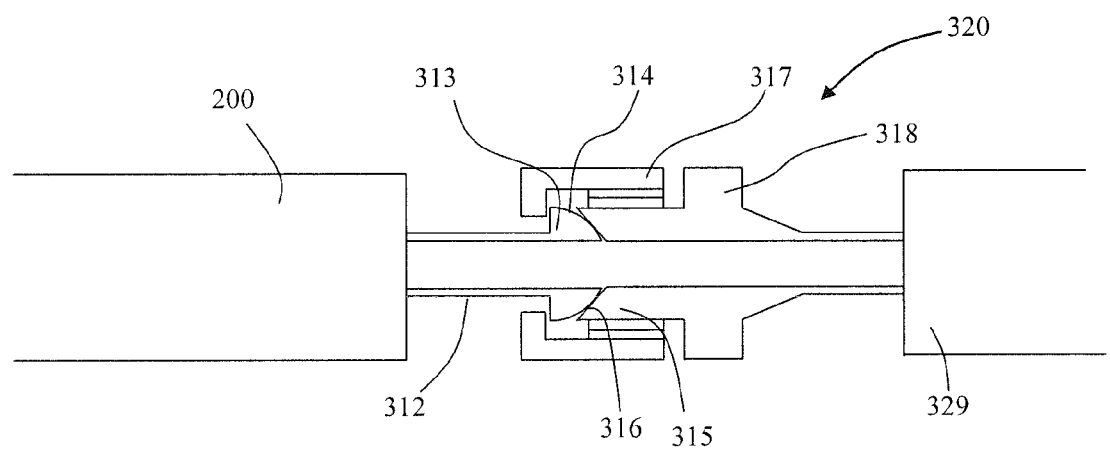
FIG. 12 shows a schematic of a fluid connection between two rigid raft assemblies.

The FIG. 12 connection 320 is substantially similar to that described above in relation to FIG. 11, and like features are provided with like reference numerals. However, in FIG. 12, the female connector 315 is provided to a rigid raft assembly 329. The rigid raft assembly 329 may be of any construction and/or arrangement, such as those described elsewhere herein in relation to rigid raft assemblies 200. The arrangement described above in relation to FIGS. 11 and 12 may be particularly useful if the positions of the two components 200, 319/329 were accurately known, or if they are mounted on anti-vibration mounts which allow the components 200, 319/329 to adjust their position in response to the pipe connection 310/320 being tightened together. Additionally or alternatively, the FIGS. 11 and 12 connection may be useful if there are no concerns over vibrations being transferred between the connected components—such as when both components 200, 319/329 are mounted on anti-vibration mounts and/or when the components 200, 319/329 are in the same vibration environment.

Figure 13:
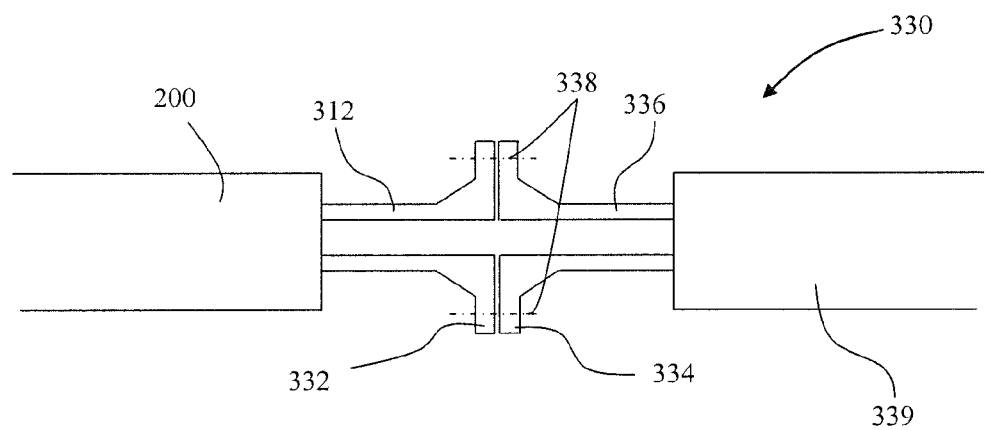
FIG. 13 shows a schematic of a fluid connection between two rigid raft assemblies.

An in-line fluid connector 330 is shown in FIG. 13. The in-line connector comprises two flanges 332, 334 connected together using fasteners 338, such as bolts, so as to form a fluid tight seal. The flanges 332, 334 are formed at the end of respective fluid pipes 312, 336. The fluid pipes may be connected to, or form a part of, respective parts 200, 339 of a fluid system, either one or more of which may be a rigid raft assembly 200 as described herein.

Figure 14:
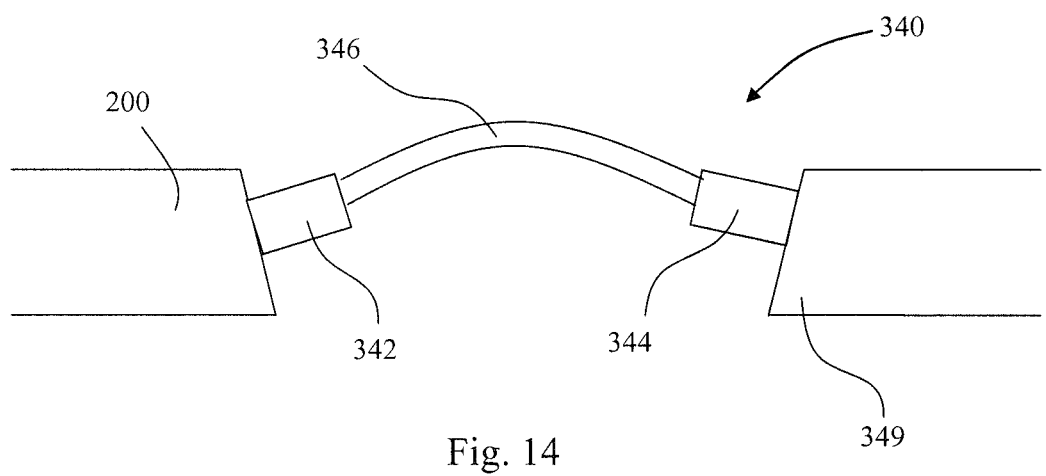
FIG. 14 shows a schematic of a fluid connection between two rigid raft assemblies.

FIG. 14 shows a flexible fluid connection 340, which comprises a flexible pipe 346 extending between two parts 200, 349 of a fluid system, either one or more of which may be a rigid raft assembly 200 as described herein. The two parts 200, 349 may have a respective connecting part 342, 344 extending therefrom, for connection to the flexible pipe 346. This arrangement may be useful if the position of two components 200, 349 is not accurately known and/or if the transmission of vibration from one to the other is to be avoided. The length of the flexible pipe 346 may not be particularly well known, for example as a result of its manufacturing method. Hence, a bend may be required in the flexible pipe 346 to accommodate any additional length and thus avoid excess tension/stretching of the flexible pipe 346 which might damage the pipe and/or components 200, 349.

Figure 15:
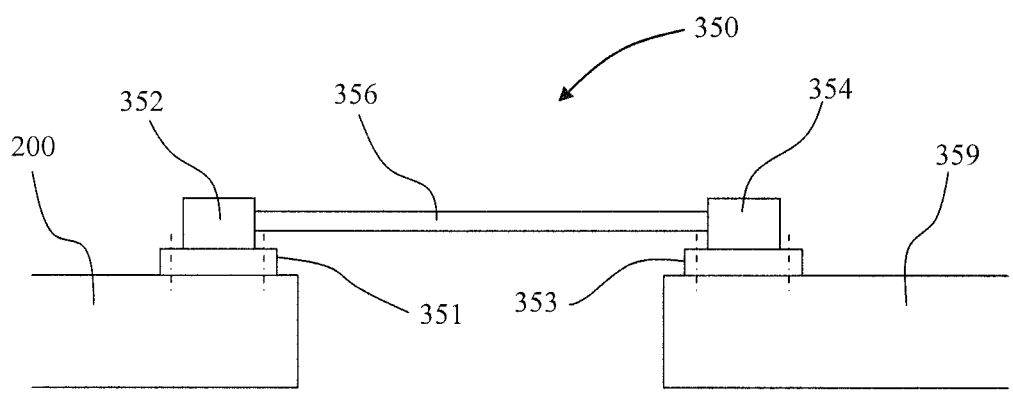
FIG. 15 shows a schematic of a fluid connection between two rigid raft assemblies.

FIG. 15 shows a fluid connection 350, which comprises a (rigid or flexible) fluid pipe 356 extending between two parts 200, 359 of a fluid system, either one or more of which may be a rigid raft assembly 200 as described herein. The two parts 200, 359 are connected to the fluid pipe 356 using right angled flange connectors 352, 354. The right angled flange connectors may be connected to the components 200, 359 using respective flanges 351, 353, which may be fastened to their respective components 200, 359, for example using bolts. Such bolts may be received by fixings in the respective component 200, 359.

Although specific fluid connections 310-350 are shown in FIGS. 11 to 15, any other suitable type of fluid connection could be used.

FIG. 16 is a schematic showing a cross-section perpendicular to the direction X-X of a gas turbine engine comprising rigid raft assemblies 200. FIG. 16 shows seven rigid raft assemblies 200A-200G (which may be referred to collectively as rigid raft assemblies 200). Each rigid raft assembly 200A-200G comprises a fluid passage 210 at least partially embedded therein (although in some embodiments a gas turbine engine 10 may comprise some rigid raft assemblies 200 with a fluid passage 210 at least partially embedded therein, and other rigid raft assemblies with no fluid passage at least partially embedded therein). Each rigid raft assembly 200 in FIG. 16 also comprises at least a part of another gas turbine engine system. The rigid raft assemblies 200A-200G represent non-limitative examples of rigid raft assemblies according to the invention. Although not shown in FIG. 16, any one or more of the rigid raft assemblies 200A-200G may comprise electrical conductors 252, 253, 254 that may, for example, take the form of any of the electrical conductors 252, 253, 254 described elsewhere herein.

Rigid raft assembly 200A has a component 280 mounted thereon. The raft 200A may thus, for example, be as described in relation to FIG. 8 above. The component 280 may have an electrical connector 280A that is connected to a corresponding connector 280B in the rigid material. This may enable, for example, the component 280 to be electrically connected to electrical conductors 252, 253, 254 in the rigid raft assembly 200A.

Rigid raft assembly 200C comprises a further fluid pipe 285 in addition to the embedded fluid pipes 210. The further fluid pipe 285 may be part of a different fluid system to the fluid pipes 210.

The rigid raft assemblies 200A-200G may be attached to the rest of the gas turbine engine 10 in any suitable manner. For example, as shown explicitly in relation to rigid raft assembly 200B, mounts 400, which may be anti-vibration mounts, may be used. Using anti-vibration mounts 400 may, for example, allow all components of the rigid raft assembly 200 to be isolated from vibrations. Thus, components of at least two gas turbine engine systems may be vibration isolated using a single set of anti-vibration mounts 400.

No fluid passage 210 is visible in the FIG. 16 view of rigid raft assembly 200D. This may be because the rigid raft assembly 200D comprises an at least partially embedded fluid passage that does not cross the plane of FIG. 16, for example because it runs substantially circumferentially around the gas turbine engine 10.

The rigid raft assemblies 200A-200D are all mounted to a fan case 24 in the example of FIG. 16. However, rigid raft assemblies such as those described by way of example herein may be provided/mounted anywhere on the engine 10. For example, one or more rigid raft assemblies 200F, 200G may be mounted between an engine core casing 28 and an engine core fairing 26. Also by way of example, one or more rigid raft assemblies 200E may be provided as at least a part of (for example in) a passage across the bypass duct 22, such as a bifurcation or splitter. In other respects, the rigid raft assemblies mounted anywhere on the engine may be as described elsewhere herein, or otherwise in accordance with the invention.

Any of the rigid raft assemblies 200A-200G may have any combination of mechanical, electrical and fluid connections to one or more (for example 2, 3, 4, 5 or more than 5) other components/systems of the gas turbine engine 10 and/or the rest of the gas turbine engine 10 itself. Examples of such connections are shown in FIG. 16, and described below, but it will be appreciated that a gas turbine engine 10 including rigid raft assemblies 200 may have connections that are different to those show in FIG. 16. For example, where only a fluid connection is shown between two components, such as two rigid raft assemblies, there may also or alternatively be an electrical connection. Similarly, where only an electrical connection is shown between two components, such as two rigid raft assemblies, there may also or alternatively be a fluid connection.

An electrical connection 291 is shown between the rigid raft assembly 200A and 200D. The electrical connection 291 may be flexible and may, for example, take the form of a flexible printed circuit such as the flexible printed circuit 250 shown in FIGS. 9 and 10. Similarly, an electrical connection 297 is provided between the rigid raft assembly 200A and a part of an airframe, or airframe installation 500, which may, for example, be a pylon. A fluid connection may additionally or alternatively be provided between the airframe 500 and a rigid raft assembly, as illustrated by the connection 296 between the airframe 500 and the rigid raft assembly 200C. The connection 296 may have any suitable arrangement, such as those described above in relation to FIGS. 11 to 15. Similarly, fluid connections 292, 293, 294, 295 may be provided between rigid raft assemblies and other components, such as other rigid raft assemblies.

A direct connection 290A, 290B is provided between the rigid raft assemblies 200B and 200C in the FIG. 16 arrangement. Such a direct connection may comprise a connector 290A provided on (for example embedded in) one rigid raft assembly 200C connected to a complimentary connector 290B provided on (for example embedded in) another rigid raft assembly 200B. Such a direct connection may, for example, provide fluid and/or electrical connection between the two rigid raft assemblies 200B, 200C.

Where reference is made herein to a gas turbine engine, it will be appreciated that this term may include a gas turbine engine/gas turbine engine installation and optionally any peripheral components to which the gas turbine engine may be connected to or interact with and/or any connections/interfaces with surrounding components, which may include, for example, an airframe and/or components thereof. Such connections with an airframe, which are encompassed by the term 'gas turbine engine' as used herein, include, but are not limited to, pylons and mountings and their respective connections. The gas turbine engine itself may be any type of gas turbine engine, including, but not limited to, a turbofan (bypass) gas turbine engine, turbojet, turboprop, ramjet, scramjet or open rotor gas turbine engine, and for any application, for example aircraft, industrial, and marine application. Rigid raft assemblies 200 such as any of those described and/or claimed herein may be used as part of any apparatus, such as any vehicle, including land, sea, air and space vehicles, such as motor vehicles (including cars and busses), trains, boats, submarines, aircraft (including aeroplanes and helicopters) and spacecraft (including satellites and launch vehicles).

It will be appreciated that many alternative configurations and/or arrangements of rigid raft assemblies 200 and gas turbine engines comprising rigid raft assemblies 200 other than those described herein may fall within the scope of the invention. For example, alternative arrangements of rigid raft assemblies 200 (for example in terms of construction, layout and/or shape of fluid passages 210 and/or rigid material 220 and/or second gas turbine engine system comprised by the rigid raft assembly 200 and/or the resulting rigid raft assembly 200) may fall within the scope of the invention and may be readily apparent to the skilled person from the disclosure provided herein. Alternative arrangements of connections (for example mechanical, electrical and/or fluid) between the rigid raft assemblies 200 and between the rigid raft assemblies 200 other components may fall within the scope of the invention and may be readily apparent to the skilled person from the disclosure provided herein. Furthermore, any feature described and/or claimed herein may be combined with any other compatible feature described in relation to the same or another embodiment.

We claim:

1. A rigid raft assembly for a gas turbine engine, the rigid raft assembly comprising a rigid material that carries at least a part of a first gas turbine engine system and at least a part of a second gas turbine engine system, wherein:
   the first gas turbine engine system is a fluid system that comprises at least one fluid passage having an axial direction along which fluid generally flows in use, the at least one fluid passage being at least partially embedded in the rigid raft assembly over substantially the whole axial length of the fluid passage such that the rigid material directly contacts the fluid passage over substantially the whole axial length of the fluid passage, and the at least one fluid passage being configured to carry at least one of sealing fluid, hydraulic fluid, a lubricant or fuel.

2. A rigid raft assembly according to claim 1, wherein:
   the second gas turbine engine system is an electrical system that comprises electrical conductors at least partially embedded in the rigid material.

3. A rigid raft assembly according to claim 1, wherein:
   the rigid material surrounds the fluid passage over at least one axial portion of the passage.

4. A rigid raft assembly according to claim 1, wherein the fluid passage is formed by a fluid pipe that is at least partially embedded in the rigid raft assembly.

5. A rigid raft assembly according to claim 1, wherein the fluid passage is formed by the rigid material.

6. A rigid raft assembly according to claim 4, wherein:
   the rigid raft assembly comprises two rigid rafts formed by the rigid material; and
   the fluid pipe is embedded between the two rigid rafts.

7. A rigid raft assembly according to claim 6, wherein:
   the rigid rafts are thin elements having an upper major surface separated by a thickness from a lower major surface; and
   the fluid pipe is located between the upper major surface of one raft and the lower major surface of the other raft.

8. A rigid raft assembly according to claim 7, wherein the fluid pipe has a cross-section that is narrower than the cross section of the upper and lower major surfaces that it is located between, and at least a part of the space between the upper major surface of said one raft and the lower major surface of said other raft is filled with a honeycomb structure.

9. A rigid raft assembly according to claim 6, wherein:
   the rigid rafts are thin elements having an upper major surface separated by a thickness from a lower major surface;
   the rigid rafts are placed side-by-side with a gap between the respective major surfaces, but substantially no gap in the thickness direction; and
   the fluid pipe is located in the gap between the rigid rafts.

10. A rigid raft assembly according to claim 1, wherein the rigid material is a rigid composite material.

11. A rigid raft assembly according to claim 1, further comprising a fluid connector in fluid communication with the fluid passage, the fluid connector being arranged to connect the fluid passage to the rest of the fluid system.

12. A gas turbine engine comprising a rigid raft assembly according to claim 1.

13. A gas turbine engine comprising two rigid raft assemblies according to claim 11, the respective fluid passages of the two rigid raft assemblies being fluidly connected via respective connectors.

14. A method of assembling a gas turbine engine that comprises a rigid raft assembly according to claim 1, the method comprising:
 mounting at least one rigid raft assembly to the rest of the gas turbine engine; and
 fluidly connecting the respective fluid passageway of the or each raft assembly to another part of the fluid system.

15. A method of servicing a gas turbine engine according to claim 12, wherein the rigid raft assembly is a first rigid raft assembly, the method comprising:
 removing the first rigid raft assembly from the gas turbine engine; and
  installing a second, pre-prepared, rigid raft assembly onto the gas turbine engine in place of the first raft assembly.

16. A rigid raft assembly according to claim 11, the fluid connector being embedded in the rigid material so as to be fixed relative to the rigid material.

17. A gas turbine engine comprising two rigid raft assemblies according to claim 13, the fluid connection between the respective fluid passages comprising a non-embedded fluid pipe and/or complimentary connectors.

18. A gas turbine engine comprising a rigid raft assembly, the rigid raft assembly comprising a rigid material that carries at least a part of a first gas turbine engine system and at least a part of a second gas turbine engine system, wherein:
 the first gas turbine engine system is at least one of a sealing fluid system, pneumatic fluid system, hydraulic fluid system, lubricant system or fuel system; and
 the first gas turbine engine system comprises at least one fluid passage having an axial direction along which fluid generally flows in use, the at least one fluid passage being at least partially embedded in the rigid raft assembly over substantially the whole axial length of the fluid passage such that the rigid material directly contacts the fluid passage over substantially the whole axial length of the fluid passage.

\* \* \* \* \*